United States Patent
Kato et al.

(10) Patent No.: US 6,853,576 B2
(45) Date of Patent: Feb. 8, 2005

(54) SEMICONDUCTOR DEVICE, METHOD FOR FABRICATING THE SAME, AND METHOD FOR DRIVING THE SAME

(75) Inventors: Yoshihisa Kato, Shiga (JP); Yasuhiro Shimada, Kyoto (JP); Takayoshi Yamada, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 10/653,201

(22) Filed: Sep. 3, 2003

(65) Prior Publication Data

US 2004/0042286 A1 Mar. 4, 2004

(30) Foreign Application Priority Data

Sep. 4, 2002 (JP) ........................................ 2002-258816

(51) Int. Cl.[7] .............................................. G11C 11/22
(52) U.S. Cl. .............. 365/145; 365/189.01; 365/189.09
(58) Field of Search ............................. 365/145, 189.01, 365/189.09, 65, 117

(56) References Cited

U.S. PATENT DOCUMENTS 6,424,571 B1 * 7/2002 Pekny ................... 365/185.21
6,438,021 B2 * 8/2002 Kato ........................... 365/145
6,804,139 B2 * 10/2004 Nordal ....................... 365/145

FOREIGN PATENT DOCUMENTS

JP        P2001-308291 A      11/2001

* cited by examiner

*Primary Examiner*—Gene N. Auduong
(74) *Attorney, Agent, or Firm*—McDermott Will & Emery LLP

(57) ABSTRACT

A semiconductor memory device has a plurality of memory cells each having a first ferroelectric capacitor for storing data as a polarization value. First voltage applying means applies a first read voltage between the pair of electrodes of the first ferroelectric capacitor composing that one of the plurality of memory cells from which data is to be read. Data reading means detects the polarization value in the first ferroelectric capacitor when the first read voltage is applied between the pair of electrodes of the first ferroelectric capacitor and thereby reads the data stored in the first ferroelectric capacitor therefrom. A hysteresis loop in the first ferroelectric capacitor is shifted in a direction of voltage opposite in polarity to the first read voltage.

17 Claims, 22 Drawing Sheets

SEMICONDUCTOR DEVICE, METHOD FOR FABRICATING THE SAME, AND METHOD FOR DRIVING THE SAME

BACKGROUND OF THE INVENTION

The present invention relates to a semiconductor memory device having a ferroelectric memory for storing data as a polarization value, to a method for fabricating the same, and to a method for driving the same.

Referring to FIGS. 22 to 25 and FIGS. 26A and 26B, a conventional semiconductor memory device will be described herein below.

FIG. 22 shows a memory cell and a peripheral circuit thereof in a conventional semiconductor memory device.

As shown in FIG. 22, the memory cell is a so-called 2T2C memory cell having two ferroelectric capacitors C0 and C1 and two pass transistors Q0 and Q1. The ferroelectric capacitor C0 has a first electrode connected to the source of the pass transistor Q0, while the ferroelectric capacitor C1 has a first electrode connected to the source of the pass transistor Q1. The ferroelectric capacitors C0 and C1 have respective second electrodes connected commonly to a cell plate line CP. The pass transistor Q0 has a drain connected to a bit line BL0, while the pass transistor Q1 has a drain connected to a bit line BL1. The bit line capacitance of the bit line BL0 is denoted by CBL0, while the bit line capacitance of the bit line BL1 is denoted by CBL1. The bit line capacitances CBL0 and CBL1 are equal to each other. The pass transistors Q0 and Q1 have respective gates connected commonly to a word line WL. A sense amplifier composed of inverters INV0 and INV1 is connected between respective one ends of the bit lines BL0 and BL1.

Each of the ferroelectric capacitors C0 and C1 retains polarization even in the state in which a voltage is not applied between the first and second electrodes and has a hysteresis loop 50 as shown in FIG. 23 in which, in the case where a positive voltage is applied to the plate line CP, the direction in which the voltage axis extends from left to right is designated as a positive direction and the direction in which the polarization axis extends upward is designated as a positive direction.

Data Write Operation

When data is written in the memory cell, a HIGH voltage is applied to the word line WL to turn ON the pass transistors Q0 and Q1 and then a pulse voltage of a positive polarity is applied to the plate line PL, while the bit lines BL0 and BL1 are placed at a LOW potential. As a result, the polarization value at the point 51 in FIG. 23 is written in each of the two ferroelectric capacitors C0 and C1.

If data "0" is written subsequently, a pulse voltage of the positive polarity is applied to the bit line BL1. As a result, the polarization state in the ferroelectric capacitor C1 follows the locus of the hysteresis loop 50 to reach the point 52 so that the polarization value at the point 52 is written in the ferroelectric capacitor C1.

If data "1" is written, on the other hand, a pulse voltage of the positive polarity is applied to the bit line BL0. As a result, the polarization state in the ferroelectric capacitor C0 follows the locus of the hysteresis loop 50 to reach the point 52 so that the polarization value at the point 52 is written in the ferroelectric capacitor C0. After the application of the write pulse voltage, the word line WL is placed at the LOW potential.

By the write operation, a positive polarization value (at the point 51) is stored in the ferroelectric capacitor C0 and a negative polarization value (at the point 52) is stored in the ferroelectric capacitor C1 if the data "0" is written. If the data "1" is written, on the other hand, the negative polarization value (at the point 52) is stored in the ferroelectric capacitor C0 and the positive polarization value (at the point 51) is stored in the ferroelectric capacitor C1. Thus, polarization values are written complementarily in the two ferroelectric capacitors C0 and C1.

Data Read Operation

When data is read from the memory cell, the bit lines BL0 and BL1 are precharged to the LOW potential, a HIGH voltage is applied to the word line WL to turn ON the pass transistors Q0 and Q1, and then a HIGH voltage is applied to the plate line CP. As a result, the ferroelectric capacitor in the polarization state at the point 51 follows the locus 53 shown in FIG. 24 to reach the polarization state at the point 54. On the other hand, the ferroelectric capacitor in the polarization state at the point 52 follows the locus 55 shown in FIG. 25 to reach the point 56.

Respective charges corresponding to the differences between the initial polarization states 51 and 52 and the new polarization states 54 and 56 are generated in the bit line capacitances CBL0 and CBL1 of the bit lines BL0 and BL1. The charges are converted to voltages with the bit line capacitances CBL0 and CBL1 and the resulting bit line potentials are amplified by the sense amplifier composed of the cross-coupled inverters INV0 and INV1 to be outputted. That is, if the polarization states at the points 51 and 52 are stored in the ferroelectric capacitors C0 and C1, the charge generated in the bit line BL0 (corresponding to the value difference between the points 54 and 51) is smaller than the charge generated in the bit line BL1 (corresponding to the value difference between the points 56 and 52) so that the bit line BL0 outputs the LOW potential. If the polarization states at the points 52 and 51 are stored in the ferroelectric capacitors C0 and C1, on the other hand, the charge generated in the bit line BL0 (corresponding to the value difference between the points 56 and 52) is larger than the charge generated in the bit line BL1 (corresponding to the value difference between the points 54 and 51) so that the bit line BL0 outputs a HIGH potential.

The output at the LOW potential from the bit line BL0 is determined as the data "0" since the polarization state stored in the former case corresponds to data "0" and the output at the HIGH potential from the bit line BL0 is determined as the data "1" since the polarization state stored in the latter case corresponds to data "1", whereby the reading of data is performed correctly.

After the reading of data, the plate line CP is restored to the LOW potential. At this time, the polarization state in each of the two ferroelectric capacitors C0 and C1 follows the locus 57 shown in FIG. 24 or the locus 55 shown in FIG. 25 to reach the point 51 or 59.

Although the polarization values are stored complementarily prior to the initiation of the read operation, the polarization states of the same polarity are observed as a result of the read operation, which is a destructive read-out operation.

By performing the foregoing write operation again, the ferroelectric capacitors C0 and C1 are restored to the complementary polarization states prior to the initiation of the read operation, whereby the read operation is completed.

If the memory cell is left in a high-temperature environment with the polarization states being stored in the ferroelectric capacitors composing the memory cell, the problem is encountered that the polarization states are printed and polarization inversion is hard to occur. This is termed imprinting and, in an imprinted ferroelectric capacitor, the hysteresis characteristic shifts in the direction of the voltage axis so that the amount of charge generated during the data read operation is reduced and the problem of reduced operating margin occurs. The problem will be described herein below in detail.

As described above, the two ferroelectric capacitors C0 and C1 complementarily store polarization values in the conventional semiconductor memory device. FIG. 26A shows the case where a positive polarization value (at the point 51) is stored. FIG. 26B shows the case where a negative polarization value (at the point 52) is stored. In the initial state, each of the two ferroelectric capacitors C0 and C1 has the hysteresis loop 60 indicated by the broken curve and they have coincident characteristics. If the ferroelectric capacitors C0 and C1 are left in a high-temperature environment (e.g., 85° C.) for a long period of time (e.g., 100 hours), the hysteresis loop 60 shifts in the direction of the voltage axis. The direction of shifting is dependent on the polarization stored. In the case shown in FIG. 26A, the positive polarization value (at the point 51) is stored so that the hysteresis loop 60 shifts in the direction of negative voltage to provide a hysteresis loop 61. In the case shown in FIG. 26B, the negative polarization value (at the point 52) is stored so that the hysteresis loop 60 shifts in the direction of positive voltage to provide a hysteresis loop 62.

Even if the semiconductor memory device is restored to a normal operating temperature (e.g., 27° C.), the ferroelectric capacitors in each of which the hysteresis loop has shifted are no more restored to the initial hysteresis loop 60 so that the hysteresis loops 61 and 62 resulting from shifting are retained.

The locus followed when a data read operation is performed has changed from the initial state. The charge generated in the case of FIG. 26A corresponds to the value difference between the points 63 and 51, while the charge generated in the case of FIG. 26B corresponds to the value difference between the points 64 and 52. It will be understood that, in the case of FIG. 26B where a negative polarization value is stored, the amount of generated charge becomes smaller than in the initial state indicated by the broken curve. This decreases the potential difference between the bit lines BL0 and BL1 and reduces operating margin for the amplification by the sense amplifier composed of the cross-coupled inverters INV0 and INV1 and the output thereof.

In the imprinted ferroelectric capacitor, a problem is also encountered during a data rewrite operation. That is, if the polarization value (at the point 51) in FIG. 26A and the polarization value (at the point 52) in FIG. 26B are rewritten to have opposite polarities, the value at the point 65 in FIG. 26A and the value at the point 66 in FIG. 26B are written as the polarization values. Thus, the difference between the polarization values (corresponding to the value difference between the points 66 and 65) in the two ferroelectric capacitors C0 and C1 is smaller than the difference between the polarization values (corresponding to the value difference between the points 51 and 52) so that data retention property is degraded.

SUMMARY OF THE INVENTION

In view of the foregoing, it is therefore an object of the present invention to increase an operating margin in reading data stored as a polarization value in a ferroelectric capacitor therefrom by applying a read voltage to each of the pair of electrodes of the ferroelectric capacitor.

To attain the object, a semiconductor memory device according to the present invention comprises: a plurality of memory cells each having a first ferroelectric capacitor for storing data as a polarization value; first voltage applying means for applying a first read voltage between a pair of electrodes of the first ferroelectric capacitor composing the one of the plurality of memory cells from which data is to be read; and reading means for detecting the polarization value in the first ferroelectric capacitor when the first read voltage is applied between the pair of electrodes of the first ferroelectric capacitor and thereby reading the data stored in the first ferroelectric capacitor therefrom, a hysteresis loop in the first ferroelectric capacitor is shifted in a direction of voltage opposite in polarity to the first read voltage.

In the semiconductor memory device according to the present invention, the hysteresis loop in the first ferroelectric capacitor has shifted preliminarily in the direction of voltage opposite in polarity to the first read voltage, so that the hysteresis loop does not shift after the application of the first read voltage. In this case, a margin in reading the data is increased since the hysteresis loop is shifted in the direction of voltage opposite in polarity to the first read voltage.

In the semiconductor memory device according to the present invention, the data is complementary data sets and each of the plurality of memory cells may have the first ferroelectric capacitors forming a pair to store the complementary data sets.

The arrangement increases a margin in reading the data even if the semiconductor memory device is a so-called 2T2C semiconductor memory device in which a memory cell has a pair of first ferroelectric capacitors for storing complementary data sets.

In this case, means for writing the same polarization value is preferably provided in each of the first ferroelectric capacitors forming the pair.

The arrangement allows, in a so-called 2T2C semiconductor memory device in which a memory cell has a pair of first ferroelectric capacitors for storing complementary data sets, the writing of the same data in each of the pair of first ferroelectric capacitors in the fabrication process therefor.

In the semiconductor memory device according to the present invention, the data is binary data and each of the plurality of memory cells has, on a one-by-one basis, the first ferroelectric capacitor for storing the binary data, the semiconductor memory device further comprising: a reference cell having a second ferroelectric capacitor for storing the binary data as a polarization value; and second voltage applying means for applying a second read voltage between a pair of electrodes of the second ferroelectric capacitor, wherein the reading means compares the polarization value in the first ferroelectric capacitor when the first read voltage is applied between the pair of electrodes of the first ferroelectric capacitor with the polarization value in the second ferroelectric capacitor when the second read voltage is applied between the pair of electrodes of the second ferroelectric capacitor and reads the binary data stored in the first ferroelectric capacitor therefrom and a hysteresis loop in the second ferroelectric capacitor is preferably shifted in a direction of voltage opposite in polarity to the second read voltage.

The arrangement also increases a margin in reading data even if the semiconductor memory device is a so-called 1T1C semiconductor memory device having a reference cell for storing reference data in addition to a memory cell for storing data to be preserved.

In this case, the reference cell is composed of a first reference cell having the second ferroelectric capacitor for storing the polarization value corresponding to one of complementary data sets and a second reference cell having the second ferroelectric capacitor for storing the polarization value corresponding to the other of the complementary data sets, the semiconductor memory device preferably further comprising: means for writing the same polarization value in each of the first and second ferroelectric capacitors.

The arrangement also allows, even in a semiconductor memory device having a first reference cell for storing one of complementary data sets and a second reference cell for storing the other of the complementary data sets, the writing of the same data in each of the respective second ferroelectric capacitors composing the first and second reference cells in the fabrication process therefor.

A first method for fabricating a semiconductor memory device according to the present invention aims at a method for fabricating a semiconductor memory device comprising a plurality of memory cells each having a ferroelectric capacitor for storing data as a polarization value and reading means for applying a read voltage between a pair of electrodes of the ferroelectric capacitor composing the one of the plurality of memory cells from which data is to be read, detecting the polarization value in the ferroelectric capacitor, and thereby reading the data stored in the ferroelectric capacitor therefrom, the method comprising the step of: applying an AC voltage in which a first voltage having the same polarity as the read voltage is larger in absolute value than a second voltage having a polarity opposite to that of the read voltage to the ferroelectric capacitor a plurality of times.

Since the first method for fabricating a semiconductor memory device comprises the step of applying the AC voltage in which the first voltage having the same polarity as the read voltage is larger in absolute value than the second voltage having the polarity different from that of the read voltage to the ferroelectric capacitor a plurality of times, the hysteresis loop in the ferroelectric capacitor can be shifted reliably in the direction of voltage opposite in polarity to the read voltage. In this case, the application of the foregoing AC voltage a plurality of times significantly increases the reliability of the semiconductor memory device even with a small amount of shifting in the hysteresis loop.

A second method for fabricating a semiconductor memory device according to the present invention aims at a method for fabricating a semiconductor memory device comprising a plurality of memory cells each having a pair of ferroelectric capacitors for storing complementary data sets as polarization values, voltage applying means for applying a read voltage between a pair of electrodes of each of the pair of ferroelectric capacitors composing the one of the plurality of memory cells from which data is to be read, and reading means for detecting the polarization values in the pair of ferroelectric capacitors when the read voltage is applied between the pair of electrodes of each of the pair of ferroelectric capacitors and thereby reading the complementary data sets stored in the pair of ferroelectric capacitors therefrom, the method comprising the step of: writing the same polarization value in each of the pair of ferroelectric capacitors and heating the pair of ferroelectric capacitors in each of which the same polarization value has been written to shift a hysteresis loop in each of the pair of ferroelectric capacitors in a direction of voltage opposite in polarity to the read voltage.

Since the second method for fabricating a semiconductor memory device comprises the step of writing the same polarization value in each of the pair of ferroelectric capacitors and heating the pair of ferroelectric capacitors to shift the hysteresis loop in each of the pair of ferroelectric capacitors in the direction of voltage opposite in polarity to the read voltage, the hysteresis loop in each of the pair of ferroelectric capacitors can be shifted reliably in the direction of voltage opposite in polarity to the read voltage in the process of fabricating a so-called 2T2C semiconductor memory device in which a memory cell has a pair of ferroelectric capacitors for storing complementary data sets.

In the second method for fabricating a semiconductor memory device, the step of writing the same polarization value in each of the pair of ferroelectric capacitors preferably includes the step of applying a write voltage higher than the voltage applied between the pair of electrodes of the pair of ferroelectric capacitors during a normal operation.

In the arrangement, an amount of shifting in the hysteresis loop caused in the fabrication process can be increased to be larger than an amount of shifting in the hysteresis loop occurring during a normal operation. In a ferroelectric capacitor having a hysteresis loop that has shifted already, the tendency of the hysteresis loop to return to the initial state is reduced even if the read voltage is applied during the normal operation so that the semiconductor memory device operates stably.

In the second method for fabricating a semiconductor memory device, the step of heating the pair of ferroelectric capacitors is preferably performed at a temperature higher than a temperature reached by each of the pair of ferroelectric capacitors during a normal operation.

In the arrangement, an amount of shifting in the hysteresis loop caused in the fabrication process can be increased to be larger than an amount of shifting in the hysteresis loop occurring during a normal operation. In a ferroelectric capacitor having a hysteresis loop that has shifted already, the tendency of the hysteresis loop to return to the initial state is reduced even if the read voltage is applied during the normal operation so that the semiconductor memory device operates stably.

A third method for fabricating a semiconductor memory device according to the present invention aims at a method for fabricating a semiconductor memory device comprising a plurality of memory cells each having a first ferroelectric capacitor for storing binary data as a polarization value, first voltage applying means for applying a first read voltage between a pair of electrodes of the first ferroelectric capacitor composing the one of the plurality of memory cells from which data is to be read, a reference cell having a second ferroelectric capacitor for storing binary data as a polarization value, second voltage applying means for applying a second read voltage between a pair of electrodes of the second ferroelectric capacitor, and reading means for comparing the polarization value in the first ferroelectric capacitor when the first read voltage is applied between the pair of electrodes of the first ferroelectric capacitor with the polarization value in the second ferroelectric capacitor when the second read voltage is applied between the pair of electrodes of the second ferroelectric capacitor and reading the binary data stored in the first ferroelectric capacitor therefrom, the method comprising the steps of: writing the same polarization value in each of the first and second ferroelectric capacitors and heating the first and second ferroelectric capacitors in each of which the same polarization value has been written to shift a hysteresis loop in the first ferroelectric capacitor in a direction of voltage opposite in polarity to the first read voltage and shift a hysteresis loop in the second ferroelectric capacitor in a direction of voltage opposite in polarity to the second read voltage.

Since the third method for fabricating a semiconductor memory device comprises the step of writing the same polarization value in each of the first and second ferroelectric capacitors and heating the first and second ferroelectric capacitors to shift the hysteresis loop in each of the first and second of ferroelectric capacitors in the direction of voltage opposite in polarity to the read voltage, the hysteresis loop in each of the first and second ferroelectric capacitors can be shifted reliably in the direction of voltage opposite in polarity to the read voltage in the process of fabricating a so-called 1T1C semiconductor memory device having a reference cell for storing reference data in addition to a memory cell for storing data to be preserved.

In the third method for fabricating a semiconductor memory device, the step of writing the same polarization in each of the first and second ferroelectric capacitors preferably includes the step of applying a write voltage higher than each of the voltages applied between the respective pairs of electrodes of the first and second ferroelectric capacitors during a normal operation.

In the arrangement, an amount of shifting in the hysteresis loop caused in the fabrication process can be increased to be larger than an amount of shifting in the hysteresis loop occurring during a normal operation. In the first and second ferroelectric capacitors each having a hysteresis loop that has shifted already, the tendency of the hysteresis loop to return to the initial state is reduced even if the read voltage is applied during the normal operation so that the semiconductor memory device operates stably.

In the third method for fabricating a semiconductor memory device, the step of heating the first and second ferroelectric capacitors is preferably performed at a temperature higher than respective temperatures reached by the first and second ferroelectric capacitors during a normal operation.

In the arrangement, an amount of shifting in the hysteresis loop caused in the fabrication process can be increased to be larger than an amount of shifting in the hysteresis loop occurring during a normal operation. In the first and second ferroelectric capacitors each having a hysteresis loop that has shifted already, the tendency of the hysteresis loop to return to the initial state is reduced even if the read voltage is applied during the normal operation so that the semiconductor memory device operates stably.

A method for driving a semiconductor memory device according to the present invention aims at a method for driving a semiconductor memory device comprising a plurality of memory cells each having a ferroelectric capacitor for storing binary data as a polarization value, voltage applying means for applying a read voltage between a pair of electrodes of the ferroelectric capacitor composing the one of the plurality of memory cells from which data is to be read, and reading means for detecting the polarization value in the ferroelectric capacitor when the read voltage is applied between the pair of electrodes of the ferroelectric capacitor and thereby reading the data stored in the ferroelectric capacitor therefrom, a hysteresis loop in the ferroelectric capacitor being shifted in a direction of voltage opposite in polarity to the read voltage, the method comprising the step of: applying a write voltage to each of the pair of electrodes of the ferroelectric capacitor such that a first absolute value of the polarization in the ferroelectric capacitor when one of the binary data is stored and a second absolute value of the polarization value in the ferroelectric capacitor when the other of the binary data is stored are different from each other.

In accordance with the method for driving a semiconductor memory device according to the present invention, a domain in which the polarization is inverted in writing the binary data can be reduced so that the fatigue degradation of a ferroelectric film is suppressed and the reliability of the semiconductor memory device is improved thereby.

In the method for driving a semiconductor memory device according to the present invention, a polarity of the write voltage corresponding to the larger one of the first and second absolute values and a polarity of the read voltage are preferably equal to each other.

If the ferroelectric capacitors are placed in a high-temperature environment, the hysteresis loop in the ferroelectric capacitor having the larger one of the first and second absolute values shifts greatly in the direction of voltage (hereinafter referred to as the direction A) opposite in polarity to the read voltage and the hysteresis loop in the ferroelectric capacitor having the smaller one of the first and second absolute values shifts slightly in the direction of voltage (hereinafter referred to as the direction B) having the same polarity as the read voltage. Since the shifting of the hysteresis loop in the direction A does not substantially change the amount of read charge, the great amount of shifting does not present a problem. Although the shifting of the hysteresis loop in the direction B sensitively changes the amount of read charge, it does not particularly present a problem, either, since the amount of shifting is small. This suppresses the influence of a change in the hysteresis loop in the ferroelectric capacitor at a high temperature on a change in the amount of read charge and thereby stabilizes the operation of the semiconductor memory device. If the write voltage corresponding to the smaller one of the first and second absolute values is provided with the same polarity as the read voltage, however, a change in hysteresis loop greatly influences a change in the amount of read charge if the ferroelectric capacitors are placed in a high-temperature environment so that the operating margin is reduced disadvantageously.

In the method for driving a semiconductor memory device according to the present invention, the smaller one of the first and second absolute values is preferably substantially zero.

In the arrangement, even if the ferroelectric capacitor storing the polarization value having the smaller one of the first and second absolute values, i.e., a nearly zero polarization value is placed in a high-temperature environment, the hysteresis loop does not shift so that the semiconductor memory device operates stably.

In the method for driving a semiconductor memory device according to the present invention, a first write voltage with which the polarization in the ferroelectric capacitor has the first absolute value and a second write voltage with which the polarization in the ferroelectric capacitor has the second absolute value are preferably supplied from different voltage sources.

The arrangement allows a voltage with which one of the binary data is written and a voltage with which the other of the binary data is written to have different values and thereby facilitates the operation of writing the binary data.

In the method for driving a semiconductor memory device according to the present invention, the read voltage is preferably not more than a coercive voltage of the ferroelectric capacitor.

In the arrangement, the polarization does not invert before and after the data read operation so that the stored polarization is retained even after the read operation and therefore a so-called non-destructive read-out operation is enabled. This obviates the necessity to perform the operation of rewriting data after the operation of reading the data and increases a read speed. The arrangement also suppresses the fatigue degradation of the ferroelectric film caused by the polarization inversion and remarkably increases the number of read operations that can be performed.

BRIEF DESCRIPTION OF THE DRAWINGS

FIGS. 4A, 4B, and 4C are views showing voltage pulses applied to the semiconductor memory device according to the first embodiment, of which FIG. 4A shows the case where the same polarization value is written, FIG. 4B shows the case where data is written, and FIG. 4C shows the case where data is read;

FIGS. 21A, 21B, 21C, and 21D are views showing voltage pulses applied to the semiconductor device according to the third embodiment, of which FIG. 21A shows the case where the same polarization value is written, FIG. 21B shows the case where data is written in a reference cell, FIG. 21C shows the case where data is written in a memory cell, and FIG. 21D shows the case where data is read;

DETAILED DESCRIPTION OF THE INVENTION

Embodiment 1

A semiconductor memory device according a first embodiment of the present invention and a method for driving the same will be described with reference to FIGS. 1 to 8.

Figure 1:
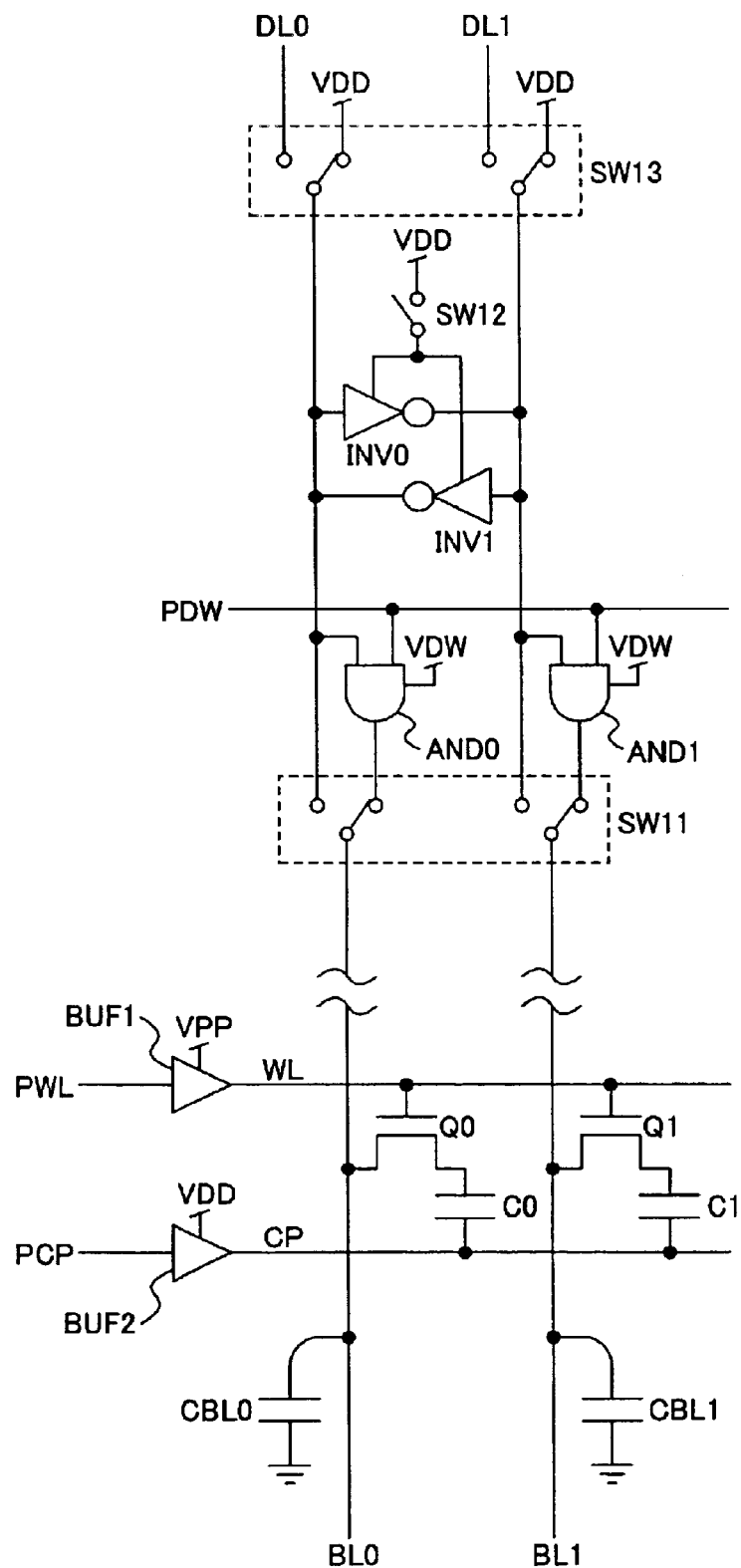
FIG. 1 is a view of a memory cell and a peripheral circuit thereof in a semiconductor memory device according to a first embodiment of the present invention, which shows a switching state when the same polarization value is written in each of ferroelectric capacitors.
Figure 2:
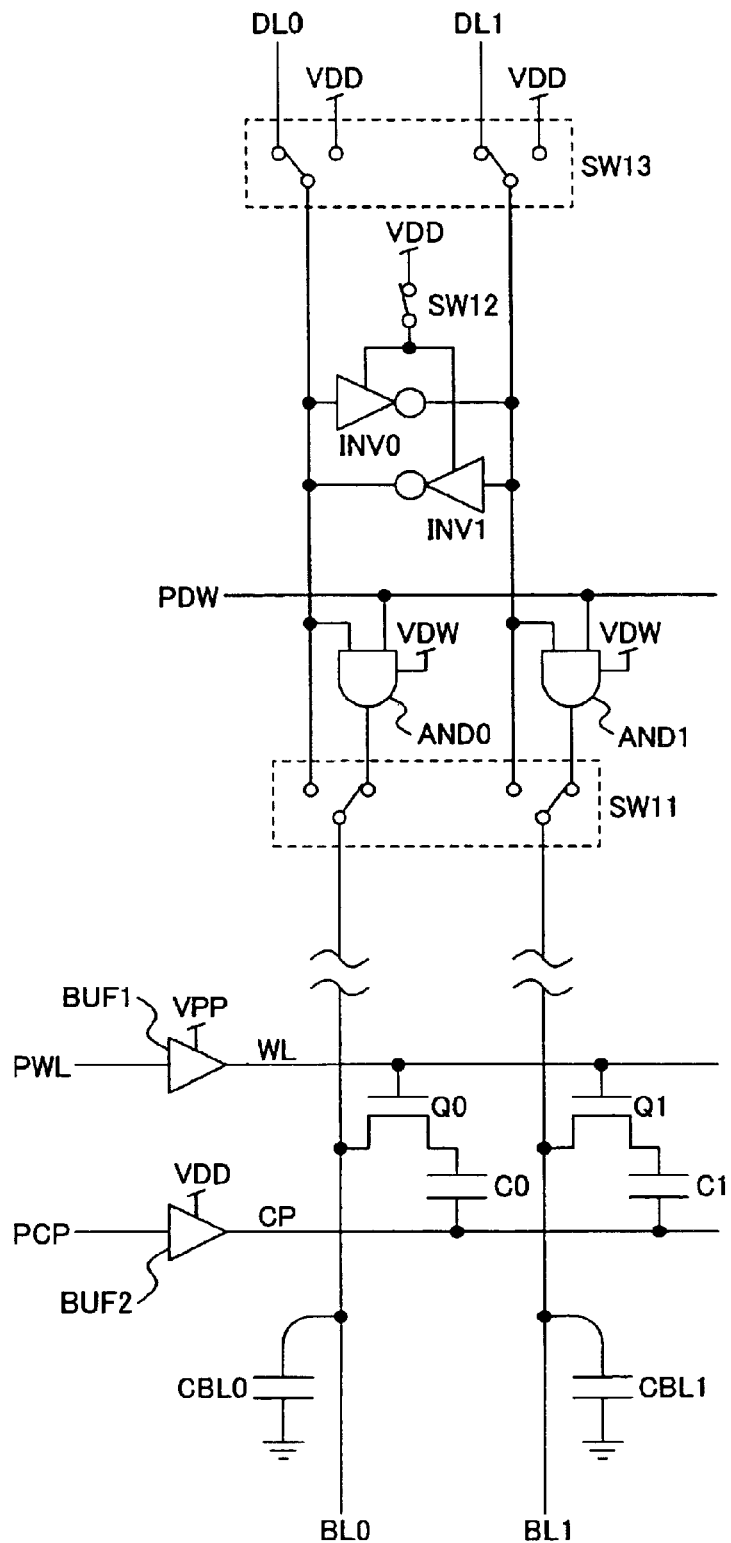
FIG. 2 is a view of the memory cell and the peripheral circuit thereof in the semiconductor memory device according to the first embodiment, which shows a switching state when data is written in the ferroelectric capacitor.
Figure 3:
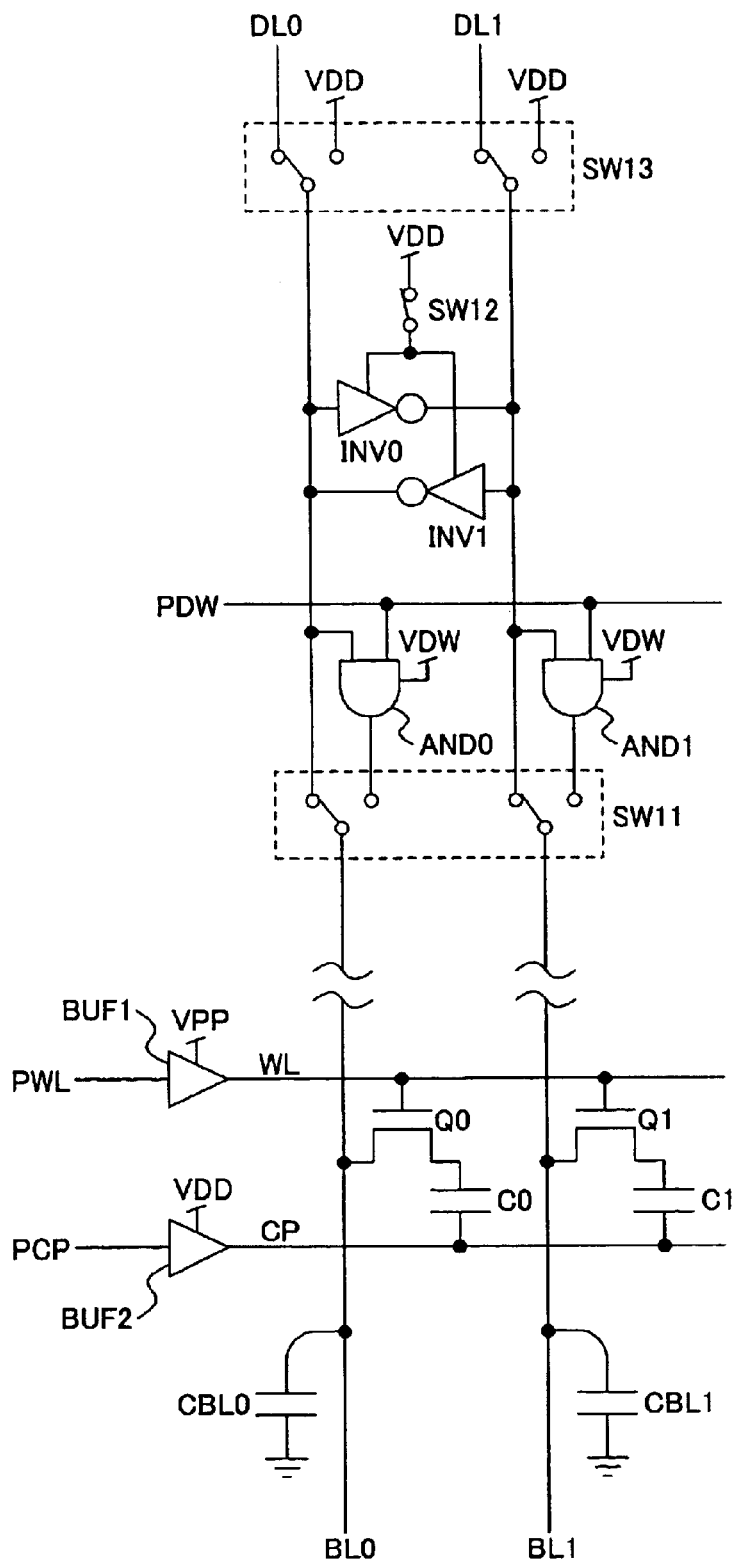
FIG. 3 is a view of the memory cell and the peripheral circuit thereof in the semiconductor memory device according to the first embodiment, which shows a switching when data is read from the ferroelectric capacitor.

FIGS. 1, 2, and 3 are views of a memory cell and a peripheral circuit thereof in the semiconductor memory device according to the first embodiment, of which FIG. 1 shows a switching state when the same polarization value is written in each of ferroelectric capacitors, FIG. 2 shows a switching state when data is written in the ferroelectric capacitor, and FIG. 3 shows a switching state when data is read from the ferroelectric capacitor.

As shown in FIGS. 1, 2, and 3, the memory cell is a so-called 2T2C memory cell having two ferroelectric capacitors C0 and C1 and two pass transistors Q0 and Q1. The ferroelectric capacitor C0 has a first electrode connected to the source of the pass transistor Q0, while the ferroelectric capacitor C1 has a first electrode connected to the source of the pass transistor Q1. The ferroelectric capacitors C0 and C1 have respective second electrodes connected commonly to a cell plate line CP. The pass transistor Q0 has a drain connected to a bit line BL0, while the pass transistor Q1 has a drain connected to a bit line BL1. The bit line capacitance of the bit line BL0 is denoted by CBL0, while the bit line capacitance of the bit line BL1 is denoted by CBL1. The bit line capacitances CBL0 and CBL1 are equal to each other. The pass transistors Q0 and Q1 have respective gates connected commonly to a word line WL.

Each of the bit lines BL0 and BL1 has one end connected to a switch SW11. The switch SW11 has one terminal connected to a sense amplifier composed of inverters INV0 and INV1 and the other terminal connected to each of AND gates AND0 and AND1. A switch SW12 is connected to a power supply line VDD for the inverters INV0 and INV1 composing the sense amplifier. An output of the sense amplifier is connected to each of the AND gates AND0 and AND1 and to a switch SW13.

The switch SW13 has one terminal connected to a power supply (VDD) and the other terminal serving as a data input/output port. A write activate signal PDW is connected to each of the AND gates AND0 and AND1. A power supply for the AND gates AND0 and AND1 is denoted by VDW.

A pulse on a VPP level is applied from a buffer BUF1 to the word line WL in response to a word line activate signal PWL, while a pulse on the VDD level is applied from a buffer BUF2 to the plate line CP in response to a plate line activate signal PCP.

The switches SW11, SW12, and SW13 are switched depending on an operation to the ferroelectric capacitors. FIG. 1 shows the switching state when the same polarization value is written in each of the two ferroelectric capacitors composing the 2T2C memory cell. FIG. 2 shows the switching state when data is written in the two ferroelectric capacitors. FIG. 3 shows the switching state when data is read from the two ferroelectric capacitors.

Same-Polarization-Value Writing Step

A description will be given herein below to the step of writing the same polarization value in each of two ferroelectric capacitors composing a 2T2C memory cell in a semiconductor memory device to which the steps of diffusion and examination have been performed already. The writing of the same polarization value is performed by placing each of the bit lines BL0 and BL1 at a LOW potential and then applying the voltage pulses shown in FIG. 4A in the switching state shown in FIG. 1.

First, the application of the word line activate signal PWL causes the buffer BUF1 to apply a positive voltage pulse (on the VPP level, e.g., 3.3 V) to the word line WL, thereby bringing the pass transistors Q0 and Q1 into a conductive state. In this state, the plate line activate signal PCP is applied such that a positive voltage pulse (on the VDD level, e.g., 1.8 V) is outputted from the buffer BUF2 onto the plate line CP. Consequently, the voltage VDD is applied from the plate line CP to the two ferroelectric capacitors C0 and C1 and then removed so that upward polarization is written in each of the two ferroelectric capacitors C0 and C1 by the plate line CP.

Figure 4A:
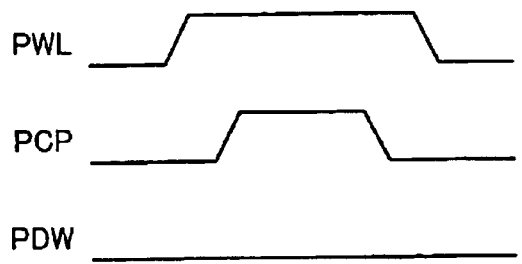
Figure 5:
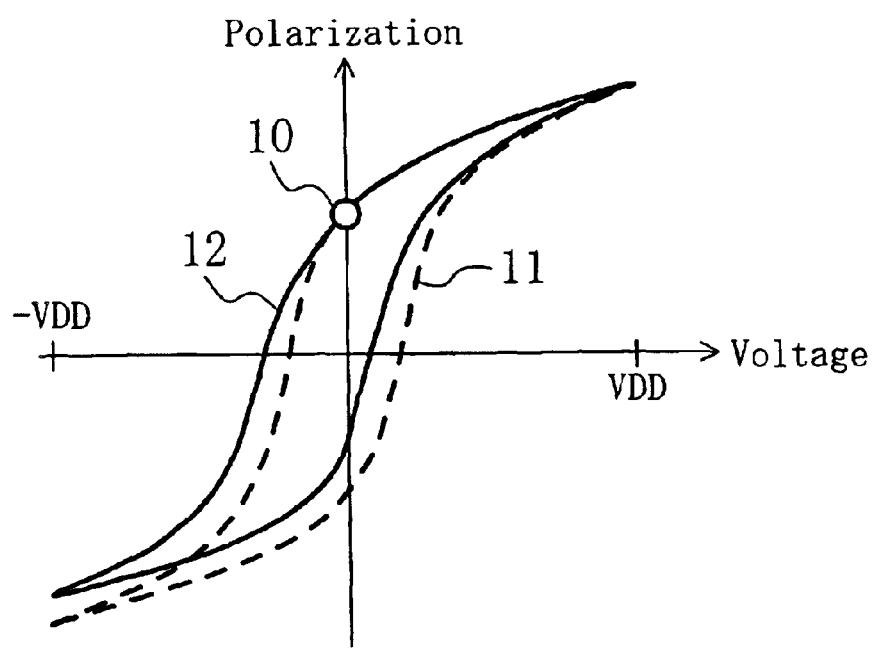
FIG. 5 is a view showing the hysteresis characteristic of polarization in each of ferroelectric capacitors composing the semiconductor memory device according to the first embodiment.
Figure 6:
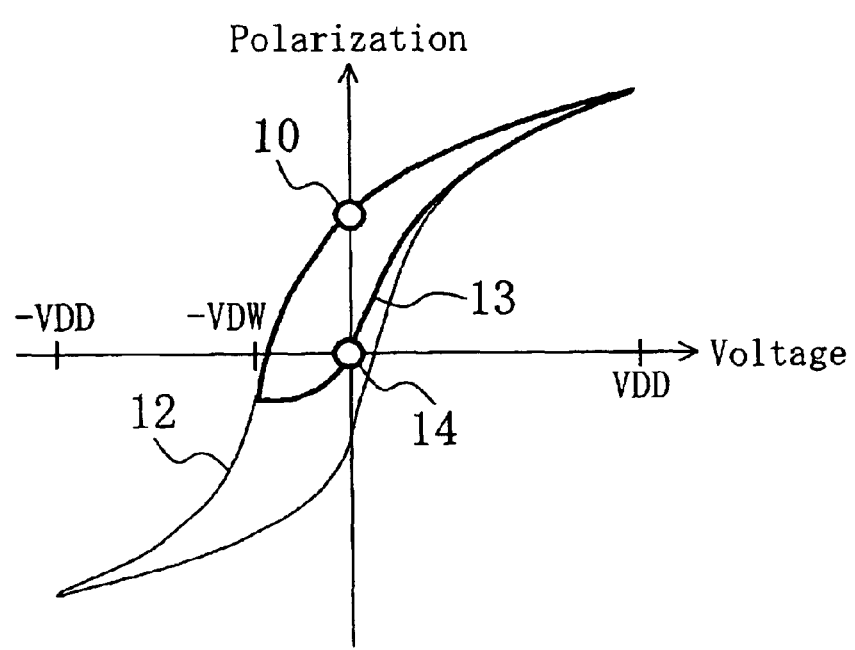
FIG. 6 is a view showing the hysteresis characteristic of polarization when data is written in the ferroelectric capacitor composing the semiconductor memory device according to the first embodiment.
Figure 7A:
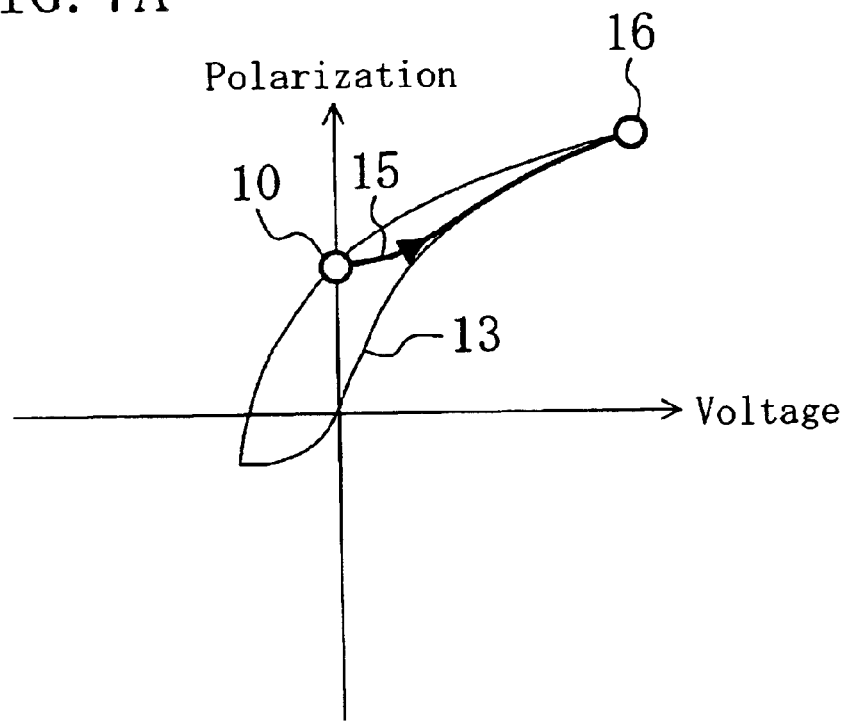
FIGS. 7A and 7B are views showing the hysteresis characteristic of polarization when data is read from the ferroelectric capacitor composing the semiconductor memory device according to the first embodiment.
Figure 7B:
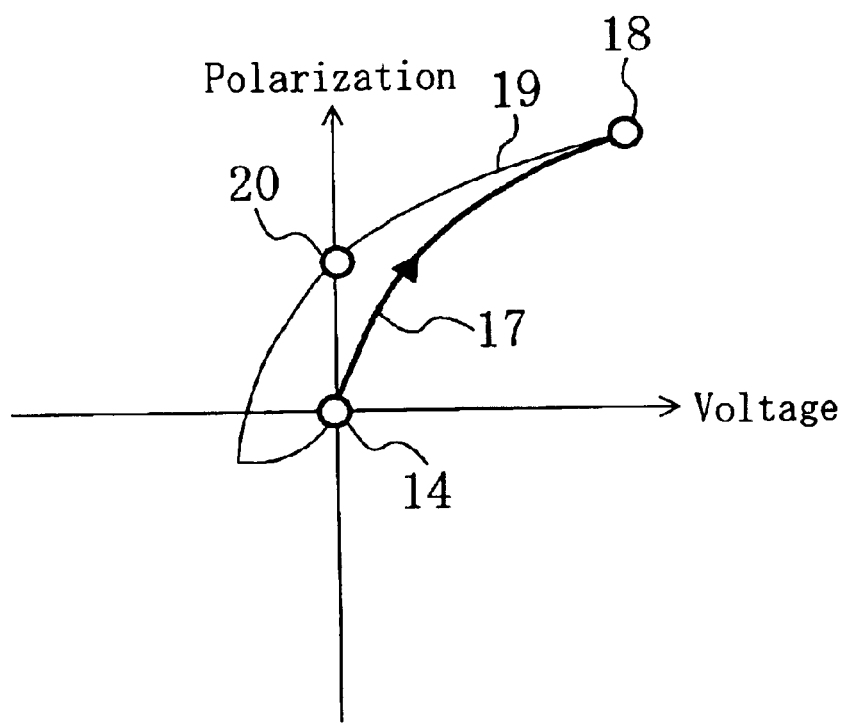

FIG. 5 shows the hysteresis characteristic of polarization in each of the ferroelectric capacitors C0 and C1. It is assumed that, in the case where a positive voltage pulse is applied to the plate line CP, the direction in which the voltage axis extends from left to right is designated as a positive direction and the direction in which the polarization axis extends upward is designated as a positive direction in FIG. 5. When the pulses shown in FIG. 4A are applied, each of the ferroelectric capacitors C0 and C1 has the polarization value at the point 10.

The same-polarization-value writing is performed with respect to the ferroelectric capacitors of each of memory cells in the semiconductor memory device so that a positive polarization value is written in each of the ferroelectric capacitors. At this point of time, the respective polarization hysteresis loops in the two ferroelectric capacitors C0 and C1 are symmetrical relative to the original point, as indicated by the broken curve 11 in FIG. 5.

High-Temperature Preserving Step

A description will be given herein below to a high-temperature preserving step performed with respect to the semiconductor memory device to which the same-polarization-value writing step has been performed already.

Specifically, the semiconductor memory device is placed in a furnace at a temperature (e.g., 150° C.) higher than the operating temperature specifications (e.g., −20+85° C.) of the semiconductor memory device and preserved in this condition for a long period of time (e.g., 10 hours). Since each of the ferroelectric capacitors is in the positive polarization state, the hysteresis loop shifts in the direction of negative voltage, as indicated by the solid curve 12 in FIG. 5.

The semiconductor memory device to which the same-polarization-value writing step and high-temperature preserving step described above have been performed is shipped in the state in which the hysteresis loop in each of the ferroelectric capacitors is shifted in the direction of negative voltage.

Data Write Operation

A description will be given herein below to a data write operation. The data write operation is performed with respect to the semiconductor memory device in which the hysteresis loop in each of the ferroelectric capacitors is shifted in the direction of negative voltage. In the data write operation, the voltage pulses shown in FIG. 4B are applied in the switching state shown in FIG. 2.

First, the application of the word line activate signal PWL causes the buffer BUF1 to apply a positive voltage pulse (on the VPP level, e.g., 3.3 V) to the word line WL, thereby bringing the pass transistors Q0 and Q1 into a conductive state. In this state, the plate line activate signal PCP is applied such that a positive voltage pulse (on the VDD level, e.g., 1.8 V) is outputted from the buffer BUF2 onto the plate line CP.

Figure 4B:
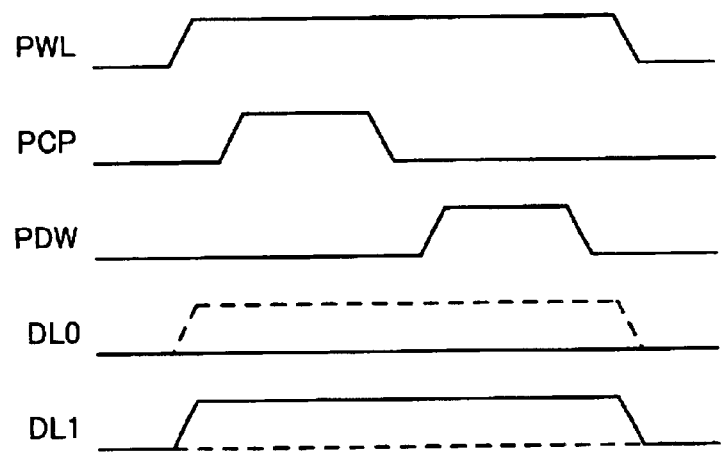

Next, if data to be written is "0", a LOW voltage is applied to a data input/output port DL0 and a HIGH voltage is applied to a data input/output port DL1, as indicated by the solid lines in FIG. 4B. If data to be written is "1", on the other hand, a HIGH voltage is applied to the data input/output port DL0 and a LOW voltage is applied to the data input/output port DL1, while a write activate signal PDW is applied to the AND gate AND0 or AND1, as indicated by the broken lines in FIG. 4B. The AND gate AND0 or AND1 connected to the data input/output port DL0 or DL1 to which the HIGH voltage has been applied outputs a positive voltage pulse (on the VDW level, e.g., 1.0 V) onto the bit line BL0 or BL1 in synchronization with the write activate signal PDW.

In the foregoing write operation, if the positive voltage is applied to the plate line CP, a voltage (VDD=1.8 V) with which the polarization in each of the ferroelectric capacitors is saturated is applied. If the positive voltage is applied to the bit line BL0 or BL1, a voltage (VDW=1.0 V) with which the polarization in each of the ferroelectric capacitors becomes zero is selected. In other words, the respective polarizations in the ferroelectric capacitors C0 and C1 are located at the points 10 and 14 on the hysteresis loop 13 shown in FIG. 6 if the data "0" is written, while the respective polarizations in the ferroelectric capacitors C0 and C1 are located at the points 14 and 10 on the hysteresis loop 13 shown in FIG. 6 if the data "1" is written. Thus, a positive polarization value and a zero polarization value are written complementarily in the two ferroelectric capacitors C0 and C1.

Data Read Operation

Figure 4C:
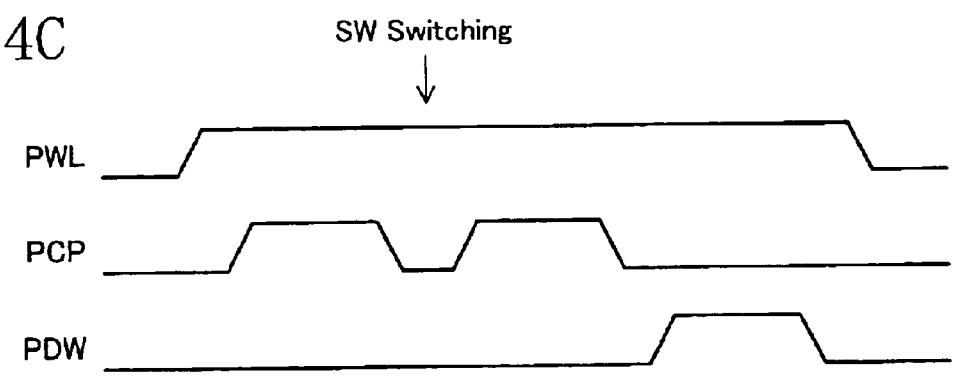

A description will be given herein below to a data read operation. In the data read operation, the bit lines BL0 and BL1 are precharged to a LOW potential and then the voltage pulses shown in FIG. 4C are applied thereto in the switching state shown in FIG. 3.

First, the application of the word line activate signal PWL causes the buffer BUF1 to apply a positive voltage pulse (on the VPP level, e.g., 3.3 V) to the word line WL, thereby bringing the pass transistors Q0 and Q1 into a conductive state. In this state, the plate line activate signal BCP is applied such that a positive voltage pulse (on the VDD level, e.g., 1.8 V) is outputted from the buffer BUF2 onto the plate line CP. Consequently, the polarization in the ferroelectric capacitor C0 or C1 located at the point 10 follows the locus 15 shown in FIG. 7A to reach the point 16. On the other hand, the polarization in the ferroelectric capacitor C0 or C1 located at the point 14 follows the locus 17 shown in FIG. 7B to reach the point 18.

A charge corresponding to the difference between the respective values at the points 10 and 16 indicative of the initial polarization state and a new polarization state and a charge corresponding to the difference between the respective values at the points 14 and 18 indicative of the initial polarization state and a new polarization state are generated in the bit line capacitance CBL0 of the bit line BL0 and in the bit line capacitance CBL1 of the bit line BL1, respectively. The charges are converted to voltages with the bit line capacitances CBL0 and CBL1 and the resulting bit line potentials are amplified by the sense amplifier composed of the cross-coupled inverters INV0 and INV1 to be outputted to the data input/output ports DL0 and DL1.

Specifically, if the respective polarizations stored in the ferroelectric capacitors C0 and C1 are located at the points 10 and 14, the bit line BL0 outputs a LOW potential since the charge (corresponding to the value difference between the points 16 and 10) generated in the bit line BL0 is lower than the charge (corresponding to the value difference between the points 18 and 14) generated in the bit line BL1. If the respective polarizations stored in the ferroelectric capacitors C0 and C1 are located at the points 14 and 10, on the other hand, the bit line BL0 outputs a HIGH potential since the charge (corresponding to the value difference between the points 18 and 14) generated in the bit line BL0 is higher than the charge (corresponding to the value difference between the points 16 and 10) generated in the bit line BL1.

The output at the LOW potential from the bit line BL0 is determined as the data "0" since the polarization state stored in the former case corresponds to data "0" and the output at the HIGH potential from the bit line BL0 is determined as the data "1" since the polarization state stored in the latter case corresponds to data "1", whereby the reading of data is performed correctly.

After the reading of data, the plate line CP is restored to the LOW potential. At this time, the respective polarizations in the two ferroelectric capacitors C0 and C1 follow the locus 13 in FIG. 7A or the locus 19 in FIG. 7B to reach the point 10 or 20.

Although the polarization values are stored complementarily prior to the initiation of the data read operation, the polarization states of the same polarity are observed as a result of the read operation, which is a destructive read-out operation.

Accordingly, the switch SW12 is switched to the right position with the SW switching timing indicated by the arrow in FIG. 4C to provide a connection between the AND gate AND0 and the bit line BL0 and a connection between the AND gate AND1 and the bit line BL1, thereby applying the plate line activate signal PCP and a write activate signal PDW. Since the sense amplifier latches the read data, the data is written again in the ferroelectric capacitors by performing the same operation as the foregoing data write operation so that the complementary polarization state prior to the initiation of the read operation is restored, whereby the read operation is completed.

Although the first embodiment has set the positive voltage pulse outputted from the buffer BUR2 onto the plate line CP at the VDD level (e.g., 1.8 V) in the same-polarization-value writing step, it is more preferable to apply a pulse with a larger voltage value within a rate voltage range. The application of a larger voltage achieves a reduction in the time of the subsequent high-temperature preserving step.

Figure 8A:
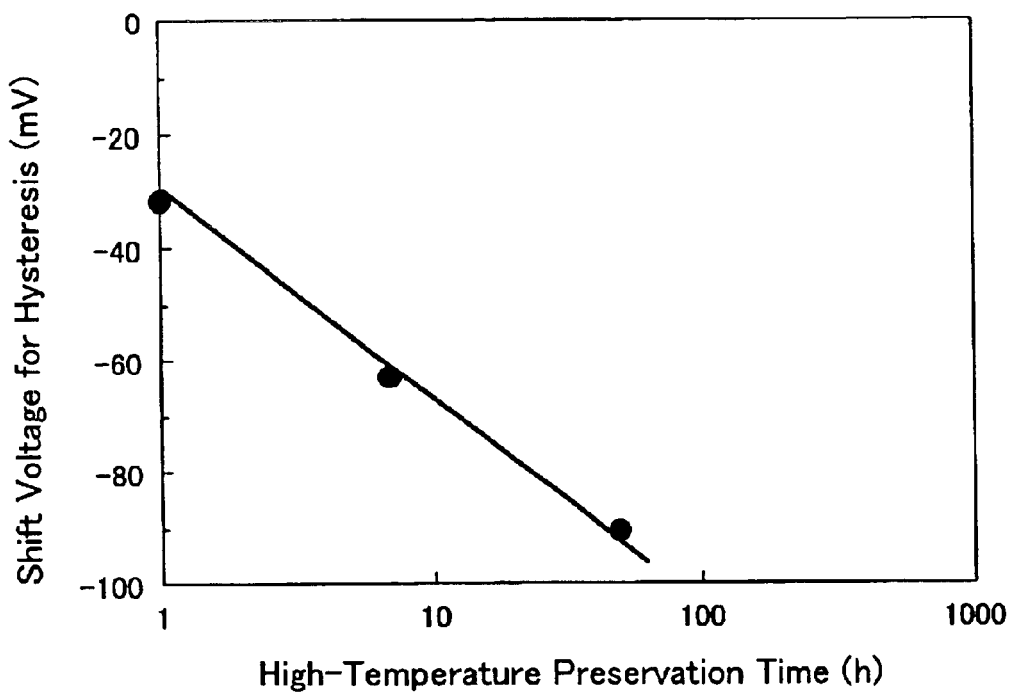
FIG. 8A is a view showing a relationship between a high-temperature preservation time and a voltage shift in hysteresis when the semiconductor memory device according to the first embodiment is preserved at 150° C.

The first embodiment has also shifted the hysteresis by the high-temperature preserving step performed subsequently to the same-polarization-value writing step. FIG. 8A shows a relationship between a high-temperature preservation time and a voltage shift in hysteresis at 150° C. which is a temperature higher than the upper-limit level of the temperatures reached by the semiconductor device, i.e., by the ferroelectric capacitors C0 and C1 during the normal operation (operating temperature specifications).

Figure 8B:
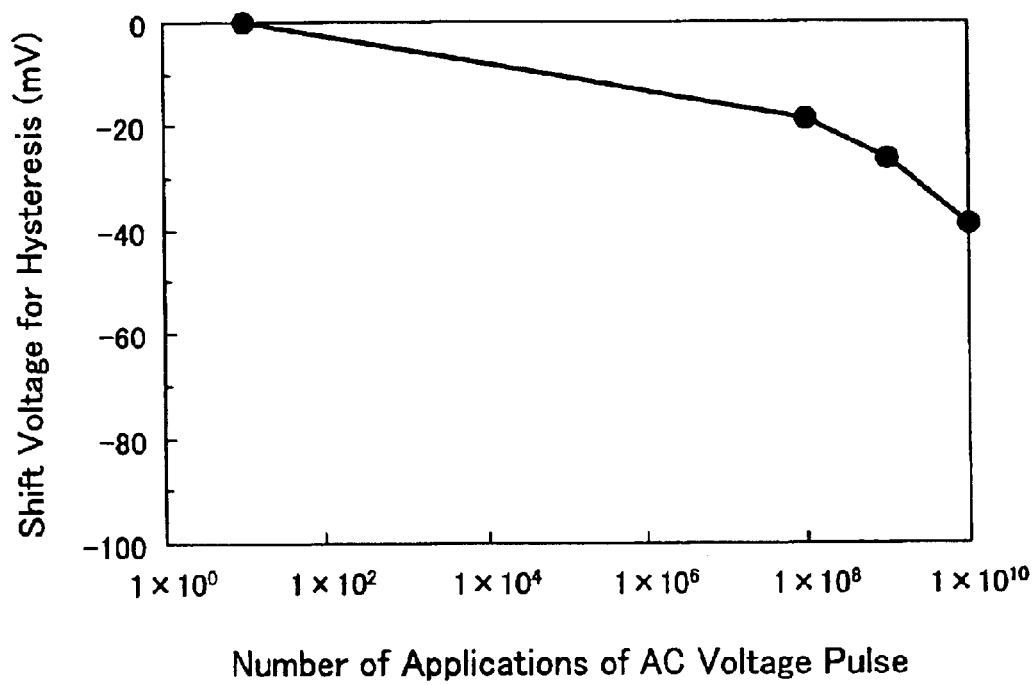
FIG. 8B is a view showing a relationship between the number of applications of asymmetric +1.8-V and −1.2-V AC voltage pulses and a voltage shift in hysteresis when the AC voltage pulses are applied at 85° C. to the semiconductor memory device.

Instead, it is also possible to place the semiconductor memory device in a furnace set at the upper-limit level of the operating temperature specifications of the semiconductor memory device or at a temperature higher than the upper-limit level and apply an AC voltage to the ferroelectric capacitors C0 and C1 a plurality of times. In this case, the AC voltage is adjusted to have an asymmetric waveform such that the voltage having the same polarity as the voltage applied to the ferroelectric capacitors C0 and C1 in the reading step is larger in absolute value than the voltage having the polarity different from that of the voltage applied to the ferroelectric capacitors C0 and C1. Specifically, an asymmetric AC voltage is applied to each of the ferroelectric capacitors C0 and C1 composing complementary cells by repeatedly performing the operation of writing the data "0" and the data "1" described above. FIG. 8B shows a relationship between the numbers of applications of +1.8-V and −1.2-V AC voltage pulses and a voltage shift in hysteresis at 85° C. which is the upper-limit level of the operating temperature specifications.

After the same-polarization-value writing step, the respective high-temperature preservation characteristics of the memory chip in which hysteresis has been shifted by high-temperature preservation and the memory chip to which the asymmetric AC voltage pulses have been applied were examined. As a result, the memory chip processed by the asymmetric AC voltage pulsing method exhibited a more excellent high-temperature preservation characteristic than the memory chip processed by the high-temperature preserving method. For example, a 2K-bit memory cell having data recorded therein was left in an environment at 125° C. and then it was checked whether or not the data was read correctly therefrom. The number of error bits in the memory chip processed by the asymmetric AC voltage pulsing method was 1/10 or smaller than the number of error bits in the memory chip processed by the high-temperature preserving method. It is natural that the memory chip in which the hysteresis has been shifted by the high-temperature preserving method had a more excellent high-temperature preservation characteristic than the memory chip in which the hysteresis has not been shifted.

In the asymmetric AC voltage pulsing method, if the time during which each of the pulses having opposite polarities is applied is changed and the application time of the lower-voltage pulse is elongated, the hysteresis loop shifts in a positive direction. In such a positive shifting direction also, an improvement in reliability was recognized in the same manner as described above. It can therefore be said that the asymmetric AC voltage pulsing method is effective in improving the reliability irrespective of an amount of shifting or the direction of shifting in a hysteresis loop.

Embodiment 2

A semiconductor memory device according a second embodiment of the present invention and a method for driving the same will be described with reference to FIGS. 9 to 17.

Figure 9:
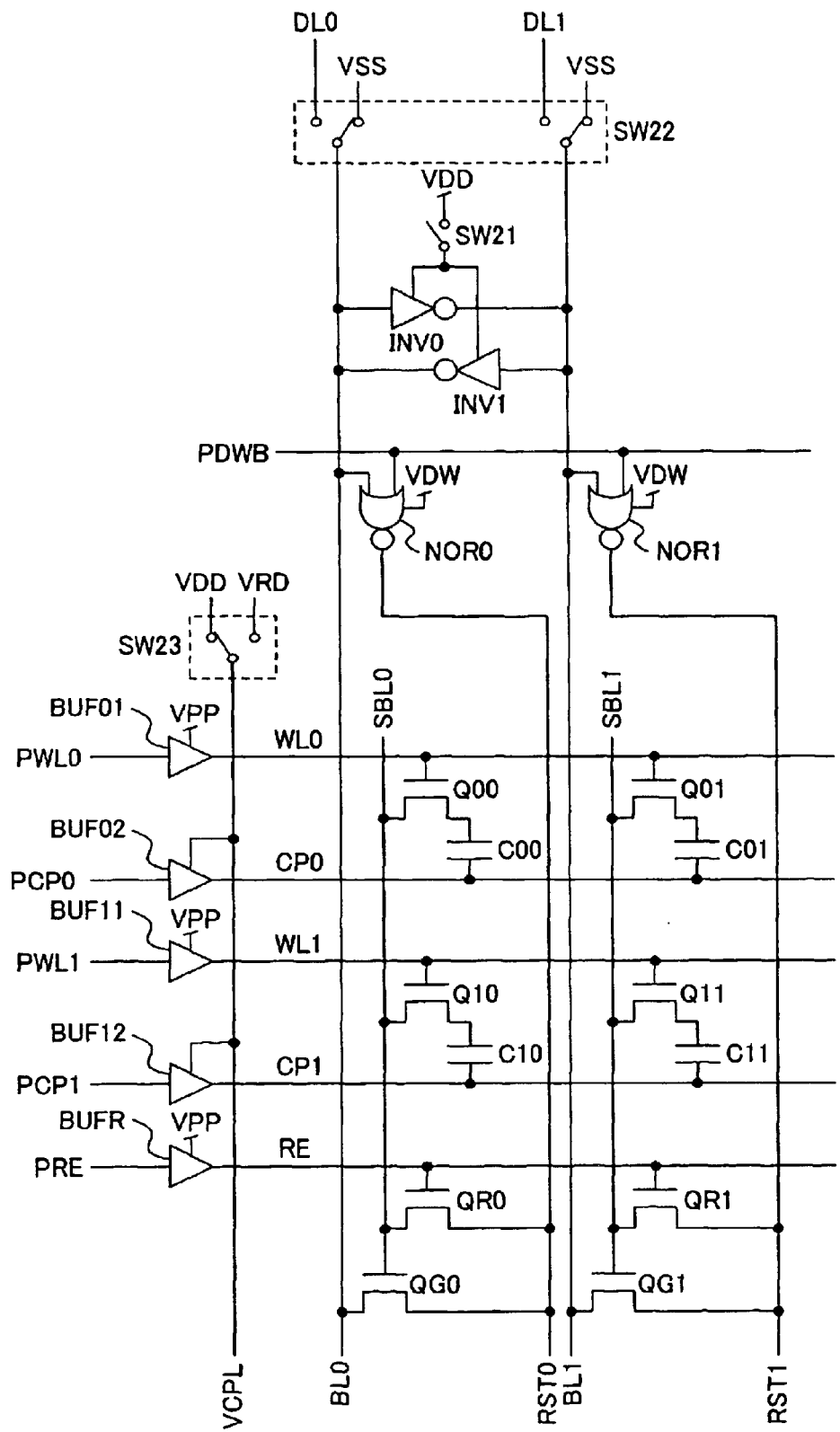
FIG. 9 is a view of a memory cell and a peripheral circuit thereof in a semiconductor memory device according to a second embodiment of the present invention, which shows a switching state when the same polarization value is written in each of ferroelectric capacitors.
Figure 10:
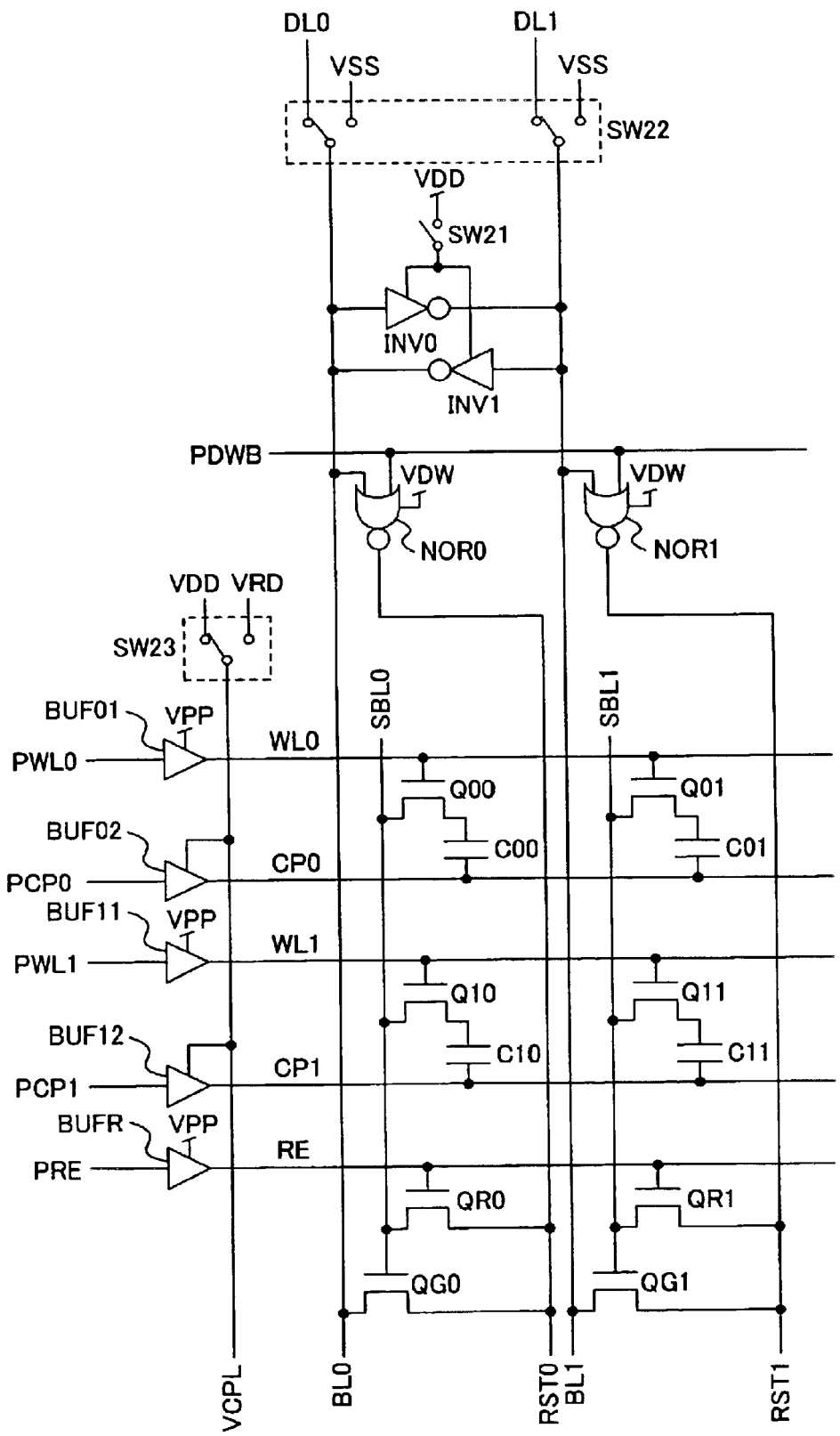
FIG. 10 is a view of the memory cell and the peripheral circuit thereof in the semiconductor memory device according to the second embodiment, which shows a switching state when data is written in the ferroelectric capacitor.
Figure 11:
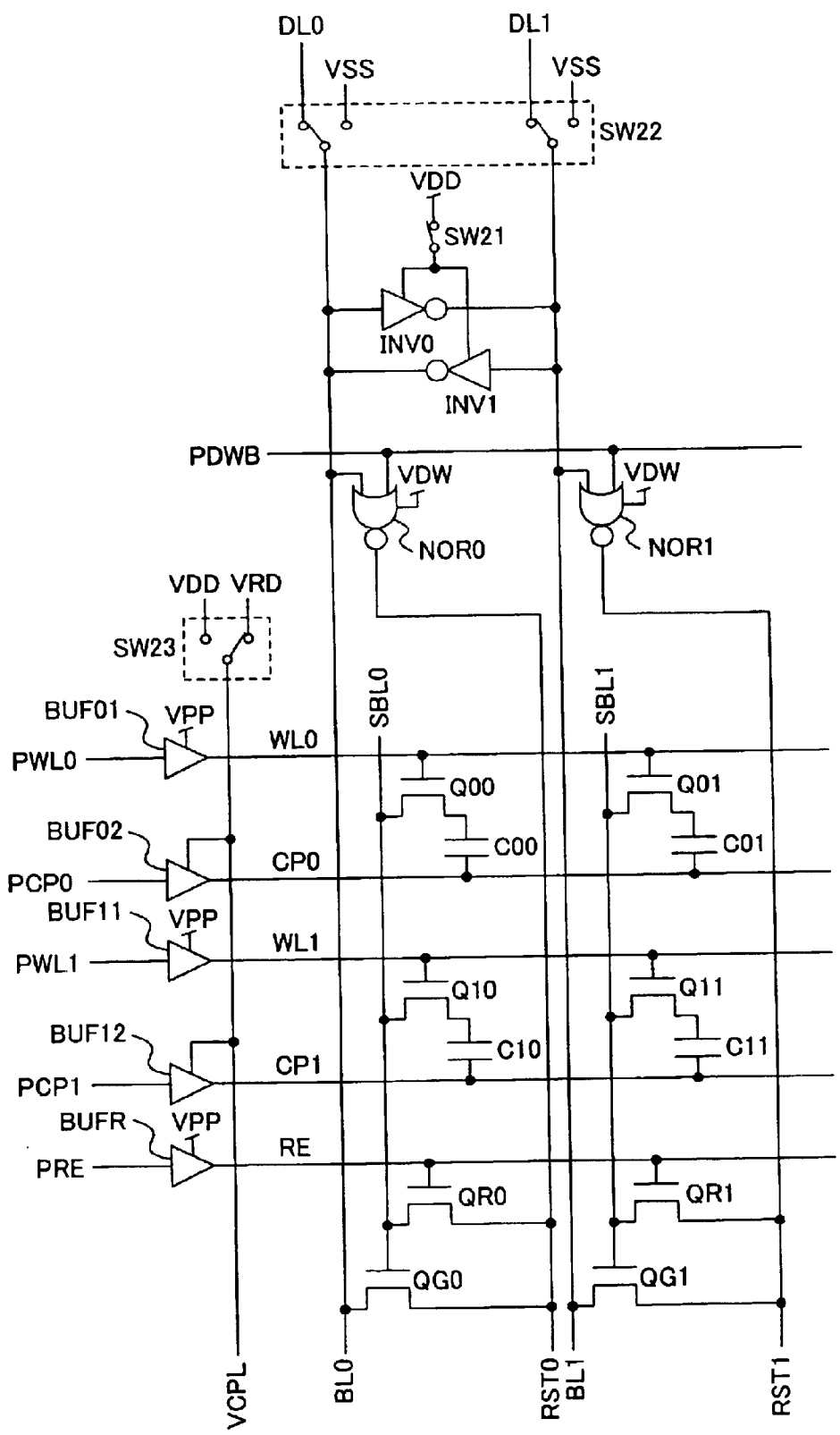
FIG. 11 is a view of the memory cell and the peripheral circuit thereof in the semiconductor memory device according to the second embodiment, which shows a switching sate when data is read from the ferroelectric capacitor.

FIGS. 9, 10, and 11 are views of a memory cell and a peripheral circuit thereof in the semiconductor memory device according to the second embodiment, of which FIG. 9 shows a switching state when the same polarization value is written in each of ferroelectric capacitors, FIG. 10 shows a switching state when data is written in the ferroelectric capacitor, and FIG. 11 shows a switching state when data is read from the ferroelectric capacitor.

As shown in FIGS. 9, 10, and 11, a plurality of memory cells are arranged as a matrix in directions in which word lines extend and in directions in which bit lines extend. The first memory cell is a 2T2C memory cell having ferroelectric capacitors C00 and C01 and pass transistors Q00 and Q01. The second memory cell is a 2T2C memory cell having ferroelectric capacitors C10 and C11 and pass transistors Q10 and Q11. The ferroelectric capacitors C00, C01, C10, and C11 have respective first electrodes connected to the respective sources of the corresponding pass transistors Q00, Q01, Q10, and Q11. The ferroelectric capacitors C00 and C01 have respective second electrodes connected commonly to a cell plate line CP0. The ferroelectric capacitors C10 and C11 have respective second electrodes connected commonly to a cell plate line CP1. The pass transistors Q00 and Q10 have respective drains connected commonly to a sub-bit line SBL0, while the pass transistors Q01 and Q11 have respective drains connected commonly to a sub-bit line SBL1. The gate of a gain transistor QG0 and the drain of a reset transistor QR0 are connected to one end of the sub-bit line SBL0, while the gate of a gain transistor QG1 and the drain of a reset transistor QR1 are connected to one end of the sub-bit line SBL1. The gain transistors QG0 and QG1 have respective drains connected to bit lines BL0 and BL1 and respective sources connected to a reset line RST. The reset transistors QR0 and QR1 have respective gates connected to a read cell select line RE and respective sources connected to the reset line RST. A sense amplifier composed of inverters INV0 and INV1 having a switch SW21 inserted between itself and a power supply (VDD) line and a switch SW22 are connected to the respective one ends of the bit lines BL0 and BL1. A selection can be made between a ground potential (VSS) and a data input/output port by using the switch SW22. An output of the sense amplifier and an activate signal PDWB are inputted to NOR gates NOR0 and NOR1. A power supply for the NOR gates NOR0 and NOR1 is denoted by VDW. A power supply voltage VDD or a read voltage VRD is supplied to a power supply for buffers BUF02 and BUF12 for driving plate lines CP0 and CP1 via a switch SW23 and a CP voltage supply line.

Same-Polarization-Value Writing Step

A description will be given herein below to the step of writing the same polarization value in each of two ferroelectric capacitors composing a 2T2C memory cell in a semiconductor memory device to which the step of diffusion and examination have been performed already. The writing of the same polarization value is performed by placing each of the bit lines BL0 and BL1 at a LOW potential and then applying the voltage pulses shown in FIG. 12 in the switching state shown in FIG. 9.

First, the application of a word line activate signal PWL0 causes a buffer BUF01 to apply a positive voltage pulse (on a VPP level, e.g., 3.3 V) to the word line WL0, thereby bringing the pass transistors Q00 and Q01 into a conductive state. In this state, a plate line activate signal PCP0 is applied such that a positive voltage pulse (on the VDD level, e.g., 1.8 V) is outputted from the buffer BUF02 onto the plate line CP0. Consequently, the voltage VDD is applied from the plate line CP0 to the two ferroelectric capacitors C00 and C01 and then removed so that upward polarization is written in each of the two ferroelectric capacitors C00 and C01 by the plate line CP0.

Figure 12:
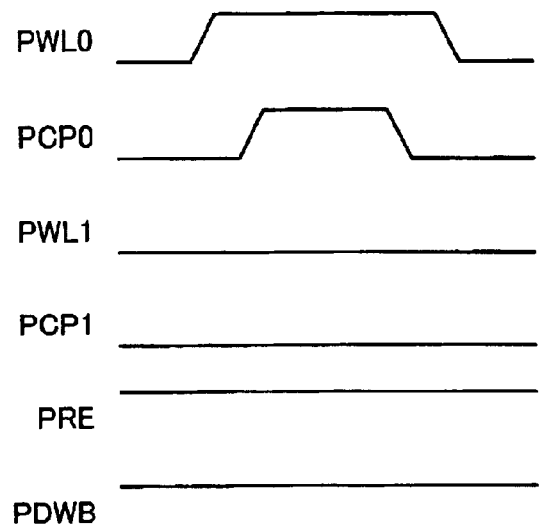
FIG. 12 is a view showing voltage pulses applied when the same polarization value is written in the semiconductor device according to the second embodiment.
Figure 15:
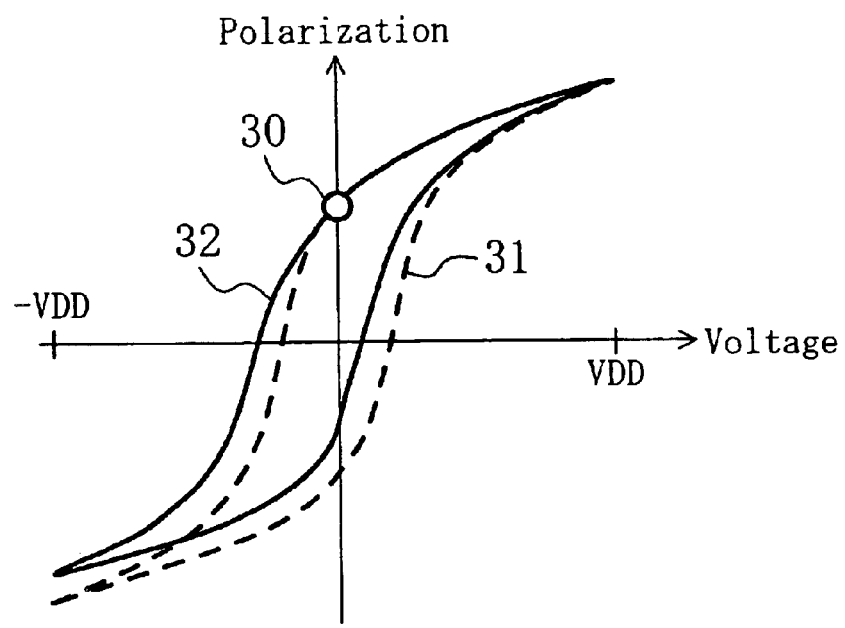
FIG. 15 is a view showing the hysteresis characteristic of polarization in each of ferroelectric capacitors composing the semiconductor memory device according to the second embodiment.
Figure 16:
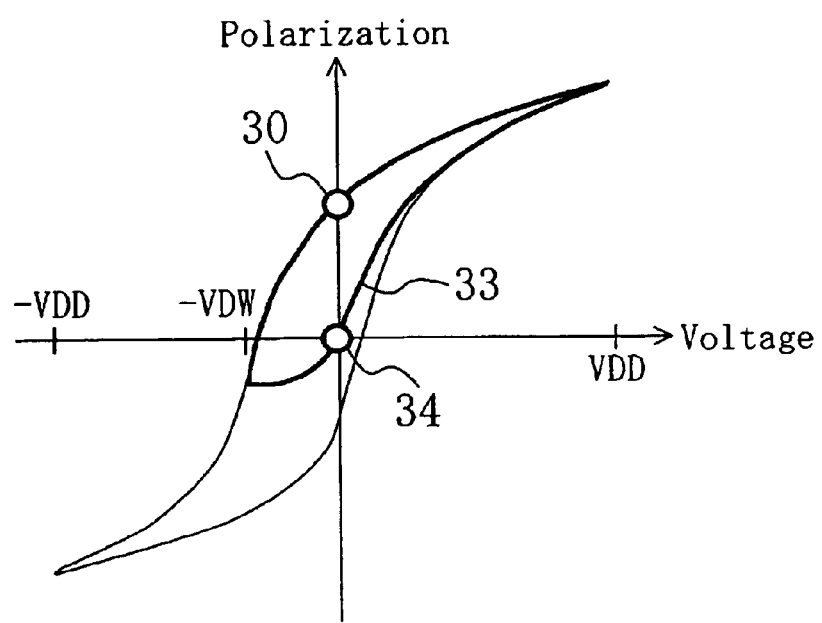
FIG. 16 is a view showing the hysteresis characteristic of polarization when data is written in the ferroelectric capacitor composing the semiconductor memory device according to the second embodiment.
Figure 17A:
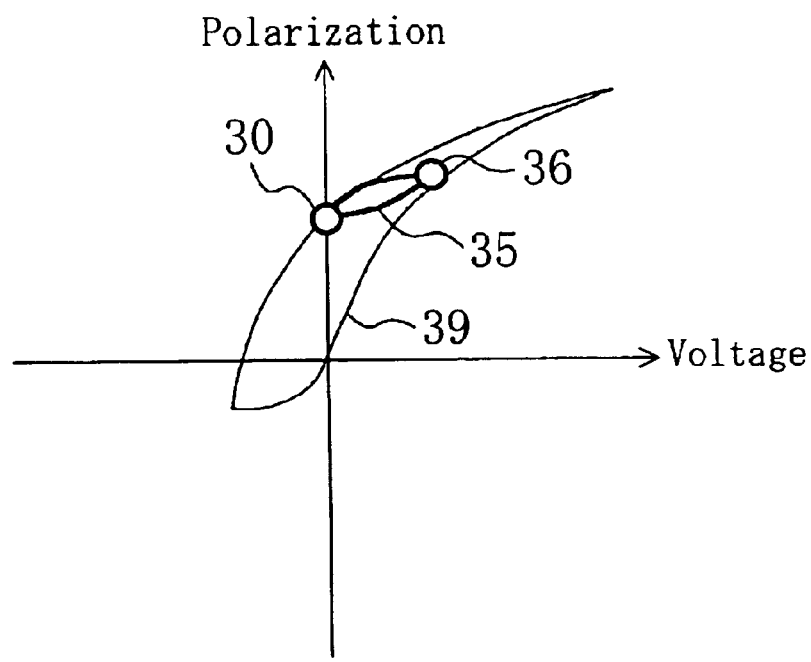
FIGS. 17A and 17B are views showing the hysteresis characteristic of polarization when data is read from the ferroelectric capacitor composing the semiconductor memory device according to the second embodiment.
Figure 17B:
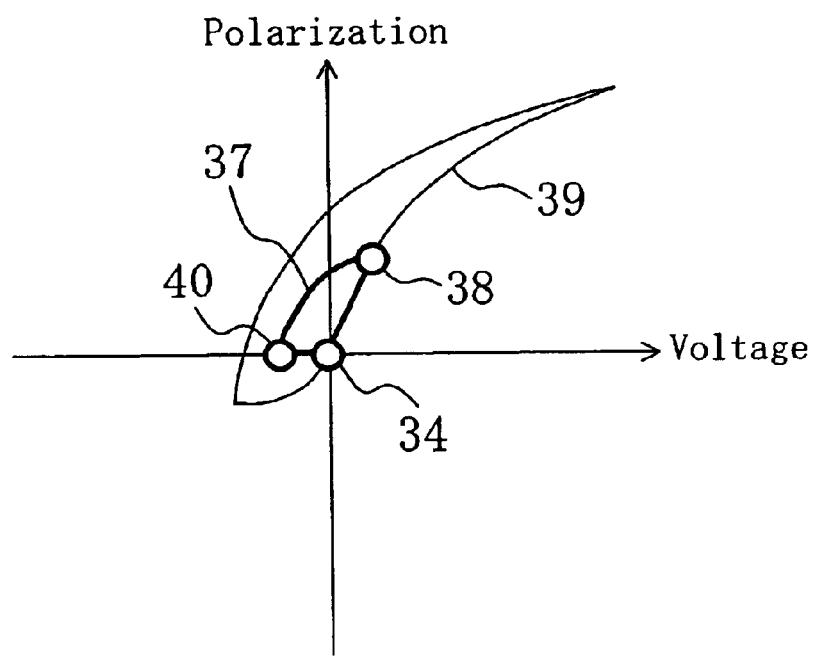

FIG. 15 shows the hysteresis characteristic of polarization in each of the ferroelectric capacitors C00 and C01. It is assumed that, in the case where a positive voltage pulse is applied to the plate line CP0, the direction in which the voltage axis extends from left to right is designated as a positive direction and the direction in which the polarization axis extends upward is designated as a positive direction in FIG. 15. When the pulse shown in FIG. 12 is applied, each of the ferroelectric capacitors C00 and C01 has the polarization value at the point 30.

The same-polarization-value writing step is performed with respect to the ferroelectric capacitors of each of memory cells in the semiconductor memory device so that a positive polarization value is written in each of the ferroelectric capacitors. At this point of time, the respective polarization hysteresis loops in the two ferroelectric capacitors C00 and C01 and in the two ferroelectric capacitors C10 and C11 are symmetrical relative to the original point, as indicated by the broken curve 31 in FIG. 15.

High-Temperature Preserving Step

A description will be given herein below to a high-temperature preserving step performed with respect to the semiconductor memory device to which the step of writing the same polarization value has been performed already.

Specifically, the semiconductor memory device is placed in a furnace at a temperature (e.g., 150° C.) higher than the operating temperature specifications (e.g., −20+85° C.) of the semiconductor memory device and preserved in this condition for a long period of time (e.g., 10 hours). Since each of the ferroelectric capacitors is in the positive polarization state, the hysteresis loop shifts in the direction of negative voltage, as indicated by the solid curve 32 in FIG. 15.

The semiconductor memory device to which the same-polarization-value writing step and high-temperature preserving step described above have been performed is shipped in the state in which the hysteresis loop in each of the ferroelectric capacitors is shifted in the direction of negative voltage.

Data Write Operation

A description will be given herein below to a data write operation. The data write operation is performed with respect to the semiconductor memory device in which the hysteresis loop in each of the ferroelectric capacitors is shifted in the direction of negative voltage. In the data write operation, the voltage pulses shown in FIG. 13 are applied in the switching state shown in FIG. 10.

First, the application of the word line activate signal PWL0 causes the buffer BUF01 to apply a positive voltage pulse (on the VPP level, e.g., 3.3 V) to the word line WL0, thereby bringing the pass transistors Q00 and Q01 into a conductive state. In this state, the plate line activate signal PCP0 is applied such that a positive voltage pulse (on the VDD level, e.g., 1.8 V) is outputted from the buffer BUF02 onto the plate line CP0.

Figure 13:
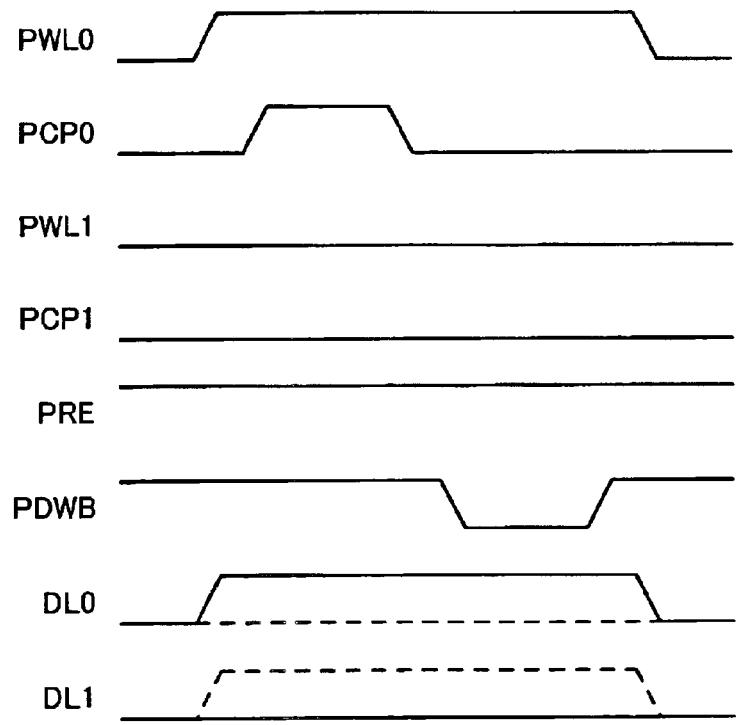
FIG. 13 is a view showing voltage pulses applied when data is written in the semiconductor device according to the second embodiment.

Next, if data to be written is "0", a LOW voltage is applied to the data input/output port DL0 and a HIGH voltage is applied to the data input/output port DL1, as indicated by the broken lines in FIG. 13. If data to be written is "1", on the other hand, the write activate signal PDWB is applied to a NOR gate NOR0 or NOR1, while a HIGH voltage is applied to the data input/output port DL0 and a LOW voltage is applied to the data input/output port DL1, as indicated by the solid lines in FIG. 13. The NOR gate NOR0 or NOR1 connected to the data input/output port DL0 or DL1 to which the LOW voltage has been applied outputs a positive voltage pulse (on the VDW level, e.g., 1.0 V) onto the reset line RST0 or RST1 in synchronization with the write activate signal PDWB.

In the foregoing write operation, if the positive voltage is applied to the plate line CP0, a voltage (VDD=1.8 V) with which the polarization in each of the ferroelectric capacitors is saturated is applied. If the positive voltage is applied to the reset line RST0 or RST1, a voltage (VDW=1.0 V) with which the polarization in each of the ferroelectric capacitors becomes zero is selected. In other words, the respective polarizations in the ferroelectric capacitors C00 and C01 are located at the points 34 and 30 on the hysteresis loop 33 shown in FIG. 16 if the data "0" is written, while the respective polarizations in the ferroelectric capacitors C00 and C01 are located at the points 30 and 34 on the hysteresis loop 33 shown in FIG. 16 if the data "1" is written. Thus, a positive polarization value and a zero polarization value are written complementarily in the two ferroelectric capacitors C00 and C01.

Data Read Operation

Figure 14:
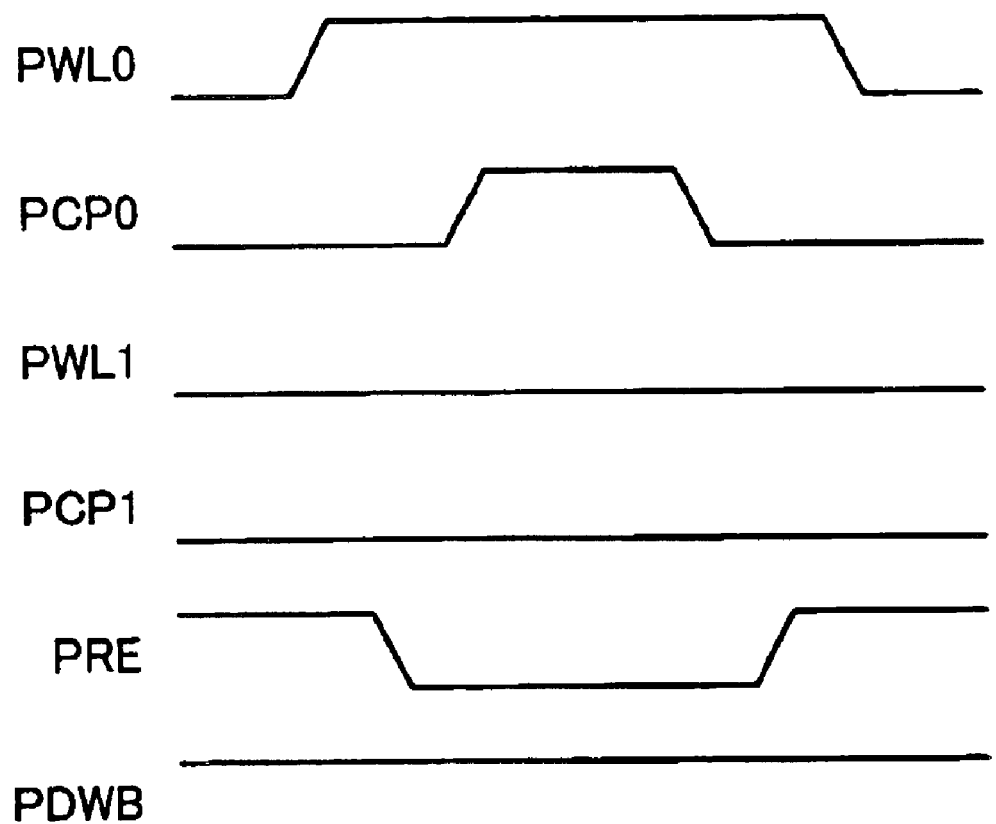
FIG. 14 is a view showing voltage pulses applied when data is read from the semiconductor device according to the second embodiment.

A description will be given herein below to a data read operation. In the data read operation, the bit lines BL0 and BL1 are precharged to a LOW potential, while a HIGH signal is inputted to the write activate signal PDWB to place each of the reset lines RST0 and RST1 at the LOW potential, and then the voltage pulses shown in FIG. 14 are applied thereto in the switching state shown in FIG. 11.

First, the application of the word line activate signal PWL0 causes the buffer BUF01 to apply a positive voltage pulse (on the VPP level, e.g., 3.3 V) to the word line WL0, thereby bringing the pass transistors Q00 and Q01 into a conductive state. In this state, an RE line activate signal PRE is applied such that a buffer BUFR places the read cell select line RE at the LOW potential and thereby turns OFF each of the reset transistors QR0 and QR1.

Then, the application of the plate line activate signal PCP0 causes the buffer BUFO2 to output a positive voltage pulse (on a VRD level, e.g., 1.2 V) to the plate line CP0. As a result, potentials resulting from capacitance division between the ferroelectric capacitor C00 and the gain transistor QG0 and capacitance division between the ferroelectric capacitor C01 and the gain transistor QG1 are generated in the sub-bit lines SBL0 and SBL1. In this case, the value of the read voltage VRD and the gate capacitances of the gain transistors QG0 and QG1 are set such that the voltage placed on the ferroelectric capacitor recording therein a zero polarization value does not exceed the coercive voltage of a ferroelectric film. Consequently, the polarization in the ferroelectric capacitor C00 or C01 located at the point 30 follows the locus 35 shown in FIG. 17A to reach the point 36. On the other hand, the polarization in the ferroelectric capacitor C00 or C01 located at the point 34 follows the locus 37 shown in FIG. 17B to reach the point 38.

A charge corresponding to the difference between the respective values at the points 30 and 36 indicative of the initial polarization state and a new polarization state and a charge corresponding to the difference between the respective values at the points 34 and 38 indicative of the initial polarization state and a new polarization state are generated in the respective capacitances of the sub-bit lines SBL0 and SBL1. The resistance between the drain and source of each of the gain transistors QG0 and QG1 varies with potentials obtained by converting the charges to voltages with gate capacitances. A change in the potential is detected by the sense amplifier composed of the cross-coupled inverters INV0 and INV1 and the detected potential is amplified to be outputted to the data input/output ports DL0 and DL1.

Specifically, if the respective polarizations stored in the ferroelectric capacitors C00 and C01 are located at the points 30 and 34, the bit line BL0 outputs a HIGH potential since the charge (corresponding to the value difference between the points 36 and 30) generated in the sub-bit line SBL0 is lower than the charge (corresponding to the value difference between the points 38 and 34) generated in the sub-bit line SBL1 and the resistance between the drain and source of the gain transistor QG0 is high. If the respective polarizations stored in the ferroelectric capacitors C00 and C01 are located at the points 34 and 30, on the other hand, the bit line BL0 outputs a LOW potential since the charge (corresponding to the value difference between the points 38 and 34) generated in the sub-bit line SBL0 is higher than the charge (corresponding to the value difference between the points 36 and 30) generated in the sub-bit line SBL1 and the resistance between the drain and source of the gain transistor QG0 is low.

The output at the HIGH potential from the bit line BL0 is determined as the data "1" since the polarization state stored in the former case corresponds to data "1" and the output at the LOW potential from the bit line BL0 is determined as the data "0" since the polarization state stored in the latter case corresponds to data "0", whereby the reading of data is performed correctly.

After the reading of data, the plate line CP0 is restored to the LOW potential. At this time, the respective polarizations in the two ferroelectric capacitors C00 and C01 follow the locus 35 in FIG. 17A or the locus 37 in FIG. 17B to reach the point 30 or 40.

If the read cell select line RE is then placed at the HIGH potential to turn ON the reset transistors QR0 and QR1, the voltage between the electrodes of each of the ferroelectric capacitors C00 and C01 becomes zero so that the polarizations in each of the ferroelectric capacitors C00 and C01, which has been located at the point 40, moves to the point 34.

Even after the read operation, the same polarization is observed at each of the points 30 and 34, which are the locations of the polarizations stored before the initiation of the read operation, so that the data read operation is a non-destructive read-out operation. According to the second embodiment, therefore, the operation of rewriting the data after the data read operation becomes unnecessary.

Embodiment 3

A semiconductor memory device according a third embodiment of the present invention and a method for driving the same will be described with reference to FIGS. 18 to 21.

Figure 18:
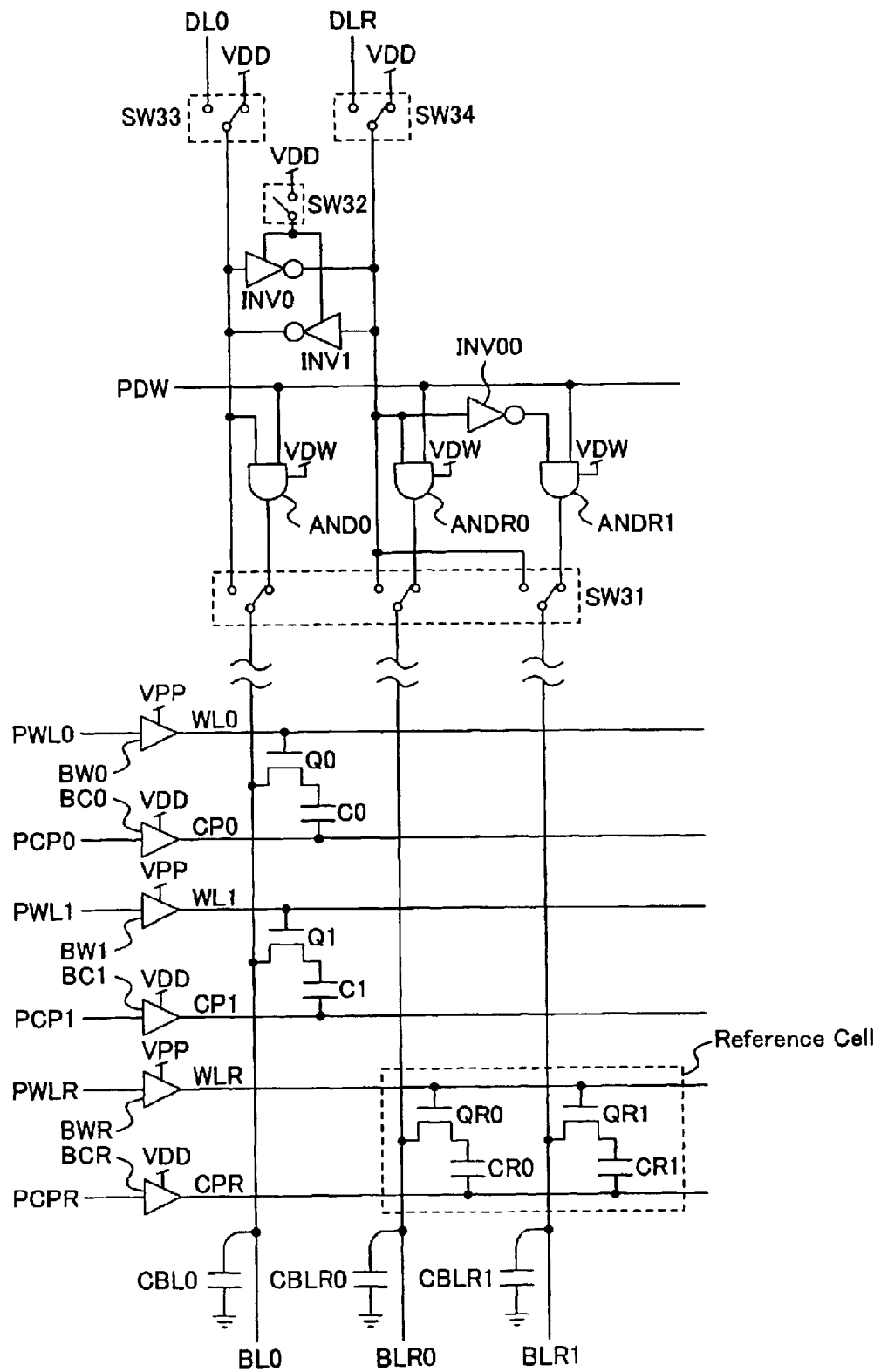
FIG. 18 is a view of a memory cell and a peripheral circuit thereof in a semiconductor memory device according to a third embodiment of the present invention, which shows a switching state when the same polarization value is written in each of ferroelectric capacitors.
Figure 19:
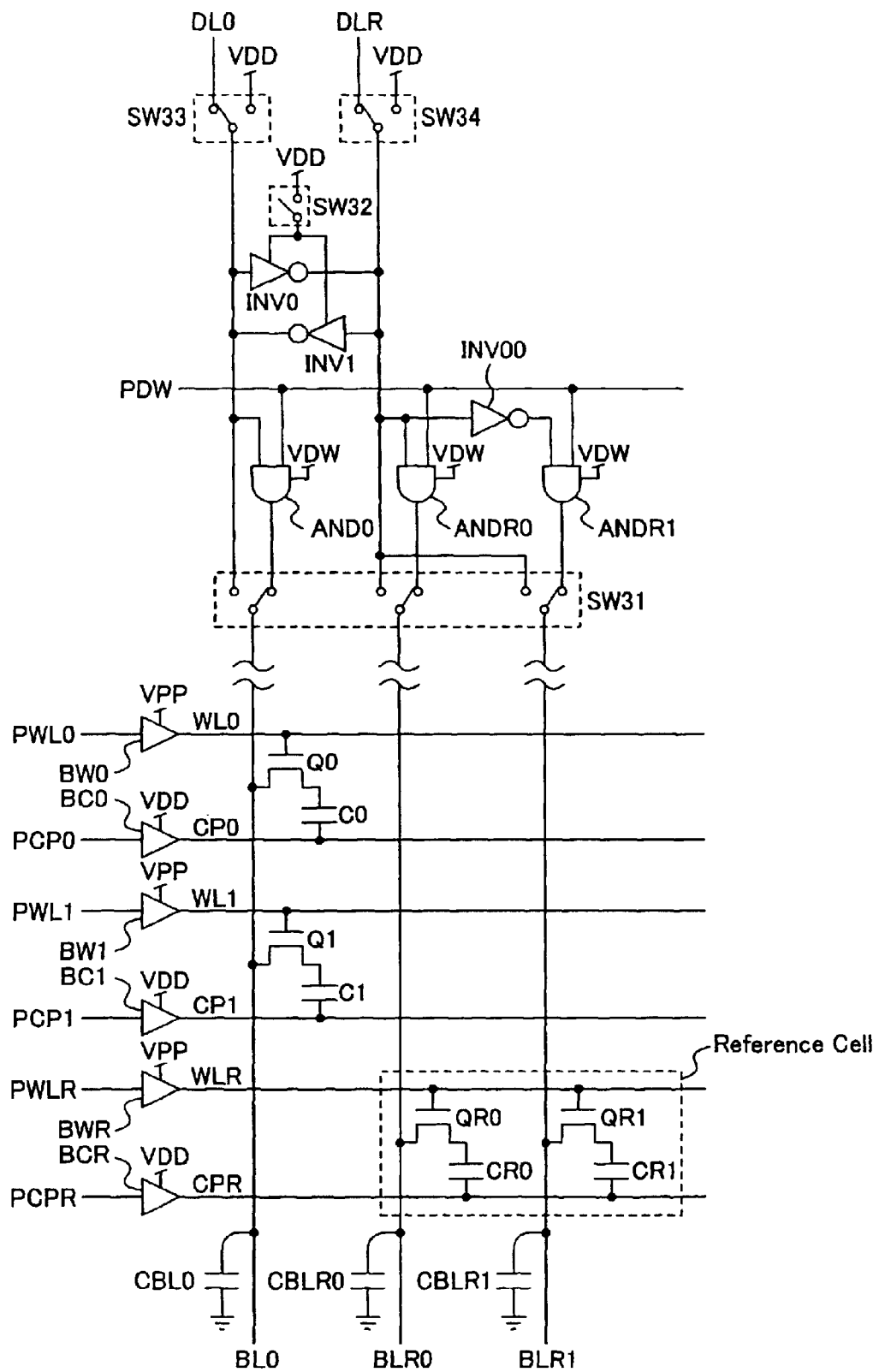
FIG. 19 is a view of the memory cell and the peripheral circuit thereof in the semiconductor memory device according to the third embodiment, which shows a switching state when data is written in the ferroelectric capacitor.
Figure 20:
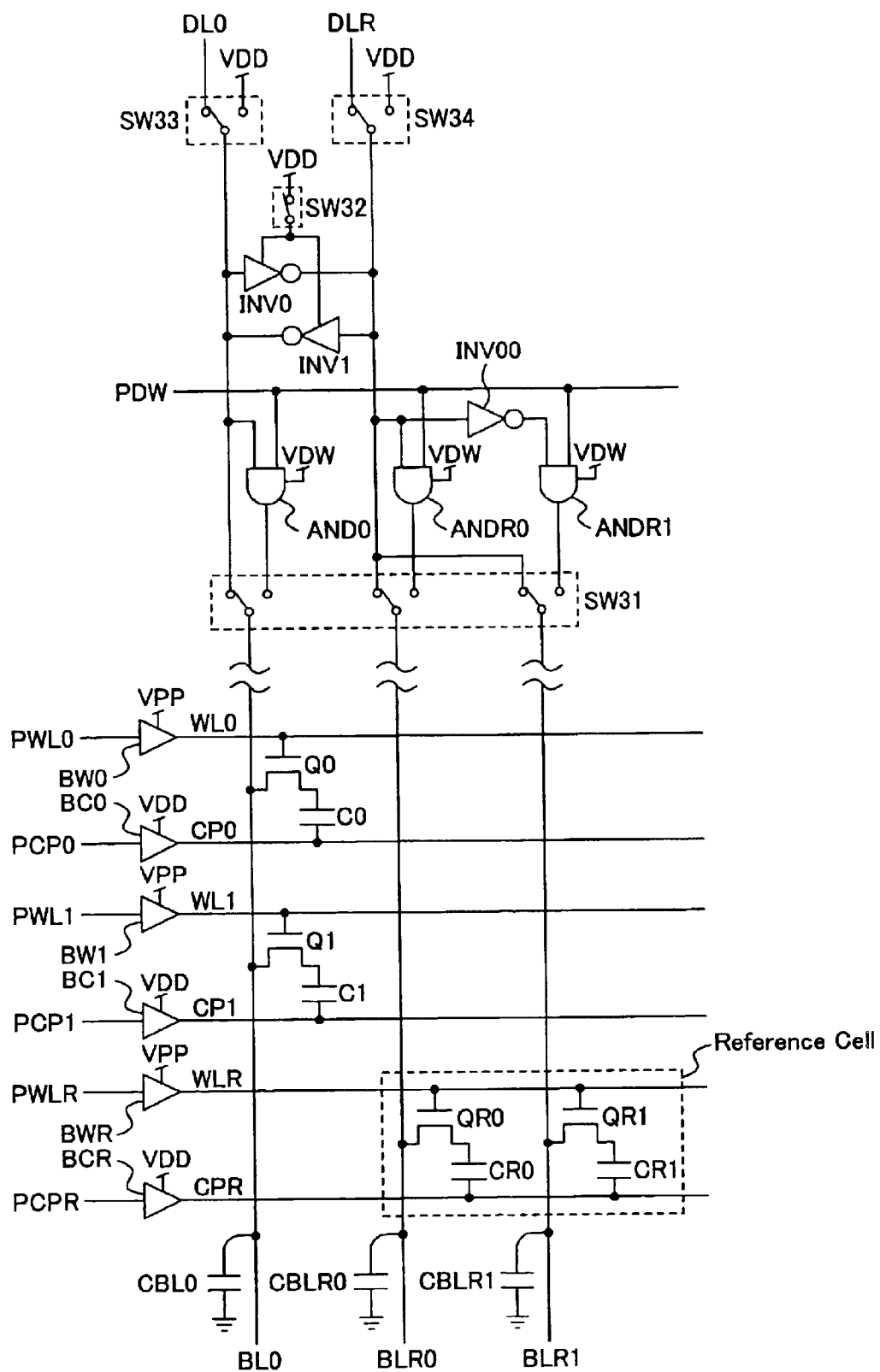
FIG. 20 is a view of the memory cell and the peripheral circuit thereof in the semiconductor memory device according to the third embodiment, which shows a switching when data is read from the ferroelectric capacitor.

FIGS. 18, 19, and 20 are views of a memory cell and a peripheral circuit thereof in the semiconductor memory device according to the third embodiment, of which FIG. 18 shows a switching state when the same polarization value is written in each of ferroelectric capacitors, FIG. 19 shows a switching state when data is written in the ferroelectric capacitor, and FIG. 20 shows a switching state when data is read from the ferroelectric capacitor.

As shown in FIGS. 18, 19, and 20, a memory cell is a so-called 1T1C memory cell having one ferroelectric capacitor and one pass transistor. The semiconductor memory device according to the third embodiment has a memory cell composed of a ferroelectric capacitor C0 and a pass transistor Q0 and a memory cell composed of a ferroelectric capacitor C1 and a pass transistor Q1. The ferroelectric capacitors C0 and C1 have respective first electrodes connected to the respective sources of the pass transistors Q0 and Q1 and respective second electrodes connected to cell plate lines CP0 and CP1. The pass transistors Q0 and Q1 have drains each connected to a bit line BL0. The capacitance of the bit line BL0 is denoted by CBL0. The pass transistors Q0 and Q1 have respective gates connected to word lines WL0 and WL1.

The semiconductor memory device according to the third embodiment has a reference cell composed of two memory cells each having the same structure as each of the memory cells for storing data. The reference cell has ferroelectric capacitors CR0 and CR1 and pass transistors QR0 and QR1. In the reference cell, the ferroelectric capacitors CR0 and CR1 have respective first electrodes connected to the respective sources of the pass transistors QR0 and QR1 and second electrodes each connected to a cell plate line CPR. The pass transistors QR0 and QR1 have respective drains connected to bit lines BLR0 and BLR1. The respective capacitances of the bit lines BLR0 and BLR1 are denoted by CBLR0 and CBLR1. The bit line capacitances CBLR0 and CBLR1 have capacitance values equal to each other. The pass transistors QR0 and QR1 have gates each connected to a word line WLR.

Each of the bit lines BL0, BLR0, and BLR1 has one end connected to a switch SW31. The switch SW31 has one terminal connected to a sense amplifier composed of inverters INV0 and INV1 and the other terminal connected to each of AND gates AND0, ANDR0, and ANDR1. A switch SW32 is connected to a power supply line VDD for the inverters INV0 and INV1 composing the sense amplifier. An output of the sense amplifier is connected to each of the AND gates AND0 and ANDR0 and to each of switches SW33 and SW34.

Each of the switches SW33 and SW34 has one terminal connected to the power supply (VDD). The other terminals of the respective switches SW33 and SW34 serve as data input/output ports DL0 and DLR. A write activate signal PDW is connected to each of the AND gates AND0, ANDR0, and ANDR1. A power supply for the AND gates AND0, ANDR0, and ANDR1 is denoted by VDW.

Pulses each on a VPP level are applied in response to word line activate signals PWL0, PWL1, and PWLR from buffers BW0, BW1, and BWR to the word lines WL0, WL1, and WLR, while pulses each on the VDD level are applied in response to plate line activate signals PCP0, PCP1, and PCPR from buffers BC0, BC1, and BCR to plate lines CP0, CP1, and CPR.

The switches SW31 to SW34 are switched in response to an operation to the ferroelectric capacitors. FIG. 18 shows the switching state when the same polarization value is written in each of the ferroelectric capacitors composing the memory cells and the reference cell. FIG. 19 shows the switching state when data is written in the ferroelectric capacitor of the memory cell or the reference cell. FIG. 20 shows the switching state when data is read from the ferroelectric capacitor of the memory cell or the reference cell.

Same-Polarization-Value Writing Step

A description will be given herein below to the step of writing the same polarization value in each of ferroelectric capacitors in a semiconductor memory device to which the steps of diffusion and examination have been performed already. The writing of the same polarization value is performed by placing each of the bit lines BL0, BLR0, and BLR1 at a LOW potential and then sequentially applying the voltage pulses shown in FIG. 21A in the switching state shown in FIG. 18 to the individual memory cells and the reference cell. The description will be given herein below by using the writing to the ferroelectric capacitor C0 as an example.

First, the application of the word line activate signal PWL0 causes the buffer BW0 to apply a positive voltage pulse (on the VPP level, e.g., 3.3 V) to the word line WL0, thereby bringing the pass transistor Q0 into a conductive state. In this state, the plate line activate signal PCP0 is applied such that a positive voltage pulse (on the VDD level, e.g., 1.8 V) is outputted from the buffer BC0 onto the plate line CP0. Consequently, the voltage VDD is applied from the plate line CP0 to the ferroelectric capacitor C0 and then removed so that upward polarization is written in the ferroelectric capacitor C0 by the plate line CP0.

As a result of the writing step, the polarization value in the ferroelectric capacitor C0 is located at the point 10 in FIG. 5 showing the hysteresis characteristic of the polarization in the ferroelectric capacitor C0, as described in the first embodiment.

The step of writing the same polarization value is performed with respect to the ferroelectric capacitors of each of the memory cells and the reference cell in the semiconductor memory device so that a positive polarization value is written in each of the ferroelectric capacitors. At this point of time, the polarization hysteresis loop in the ferroelectric capacitor is symmetrical relative to the original point, as indicated by the broken curve 11 in FIG. 5.

High-Temperature Preserving Step

A description will be given herein below to a high-temperature preserving step performed with respect to the semiconductor memory device to which the same-polarization-value writing step has been performed already.

Specifically, the semiconductor memory device is placed in a furnace at a temperature (e.g., 150° C.) higher than the operating temperature specifications (e.g., −20+85° C.) of the semiconductor memory device and preserved in this condition for a long period of time (e.g., 10 hours). Since each of the ferroelectric capacitors is in the positive polarization state, the hysteresis loop shifts in the direction of negative voltage, as indicated by the solid curve 12 in FIG. 5.

Reference-Data Writing Step

A description will be given herein below to the step of writing data in the reference cell in the semiconductor memory device to which the high-temperature preserving step has been performed already.

Figure 21A:
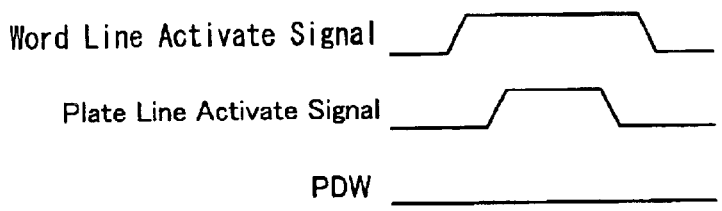
Figure 21B:
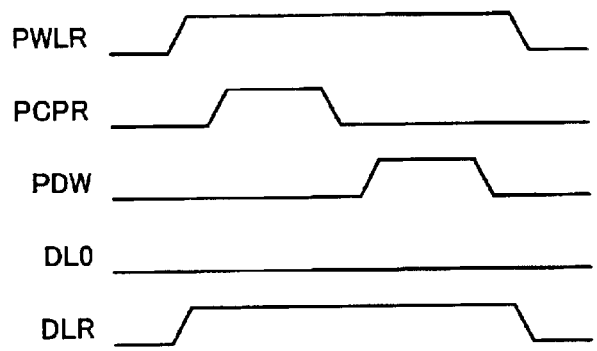

In the operation of writing data in the reference cell, the voltage pulses shown in FIG. 21B are applied in the switching state shown in FIG. 19.

First, the application of the word line activate signal PWLR causes the buffer BWR to apply a positive voltage pulse (on the VPP level, e.g., 3.3 V) to the word line WLR to bring the pass transistors QR0 and QR1 into a conductive state. In this state, the plate line activate signal PCPR is applied such that a positive voltage pulse (on the VDD level, e.g., 1.8 V) is outputted from the buffer BCR onto the plate line CPR.

A LOW voltage is applied to the data input/output port DLR and the AND gate ANDR0 outputs the LOW voltage to the bit line BLR0. On the other hand, the AND gate ANDR1 outputs a positive voltage pulse (on the VDW level, e.g., 1.0 V) onto the bit line BLR1 in synchronization with the write activate signal PDW.

In the foregoing write operation, if the positive voltage is applied to the plate line CPR, a voltage (VDD=1.8 V) with which the polarization in each of the ferroelectric capacitors is saturated is applied. If the positive voltage is applied to the bit line BLR1, a voltage (VDW=1.0 V) with which the polarization in each of the ferroelectric capacitors becomes zero is selected. In other words, the respective polarizations in the ferroelectric capacitors CR0 and CR1 are located at the points 10 and 14 on the hysteresis loop 13 shown in FIG. 6 used to describe the first embodiment. Thus, a positive polarization value and a zero polarization value are written complementarily in the two ferroelectric capacitors CR0 and CR1.

To the semiconductor memory device to which the same-polarization-value writing step and high-temperature preserving step described above have been performed, the reference-data writing step is performed in the state in which the hysteresis loop in each of the ferroelectric capacitors is shifted in the direction of negative voltage. After that, the semiconductor memory device is shipped.

Data Write Operation

Figure 21C:
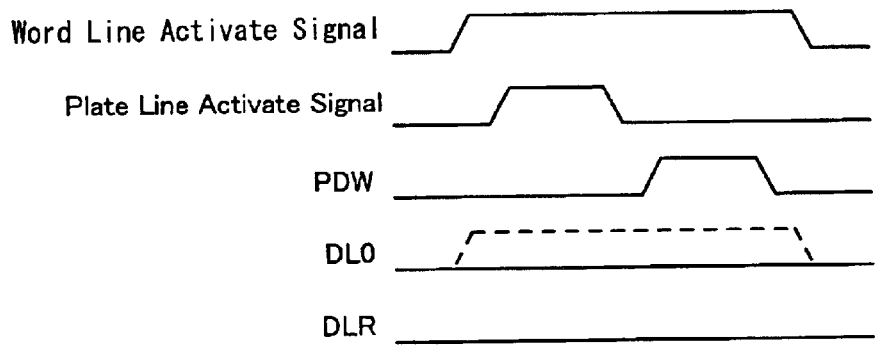

A description will be given herein below to a data write operation. The data write operation is performed with respect to the semiconductor memory device in which the hysteresis loop in each of the ferroelectric capacitors is shifted in the direction of negative voltage. In the data write operation, the voltage pulses shown in FIG. 21C are applied to each of the memory cells in the switching state shown in FIG. 19. The description will be given herein below by using the writing to the ferroelectric capacitor C0 as an example.

First, the application of the word line activate signal PWL0 causes the buffer BW0 to apply a positive voltage pulse (on the VPP level, e.g., 3.3 V) to the word line WL0, thereby bringing the pass transistor Q0 into a conductive state. In this state, the plate line activate signal PCP0 is applied such that a positive voltage pulse (on the VDD level, e.g., 1.8 V) is outputted from the buffer BC0 onto the plate line CP0.

Next, if data to be written is "0", a HIGH voltage is applied to the data input/output port DL0. If data to be written is "1", on the other hand, the write activate signal PDW is applied to the AND gate AND0, while a LOW voltage is applied to the data input/output port DL0. The AND gate AND0 outputs a LOW voltage in response to the voltage inputted to the data input/output port DL0 or outputs a positive voltage pulse (on the VDW level, e.g., 1.0 V) onto the bit line BL0 in synchronization with the write activate signal PDW.

In the foregoing write operation, if the positive voltage is applied to the plate line CP0, a voltage (VDD=1.8 V) with which the polarization in each of the ferroelectric capacitors is saturated is applied. If the positive voltage is applied to the bit line BL0, a voltage (VDW=1.0 V) with which the polarization in each of the ferroelectric capacitors becomes zero is selected. In other words, the polarization in the ferroelectric capacitor C0 is located at the point 14 on the hysteresis loop 13 shown in FIG. 6 if the data "0" is written, while the polarization in the ferroelectric capacitor C0 is located at the point 10 if the data "1" is written.

Data Read Operation

Figure 21D:
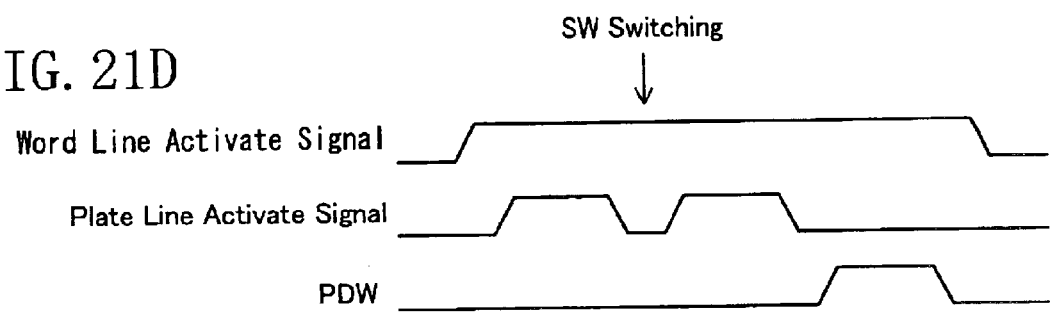
Figure 22:
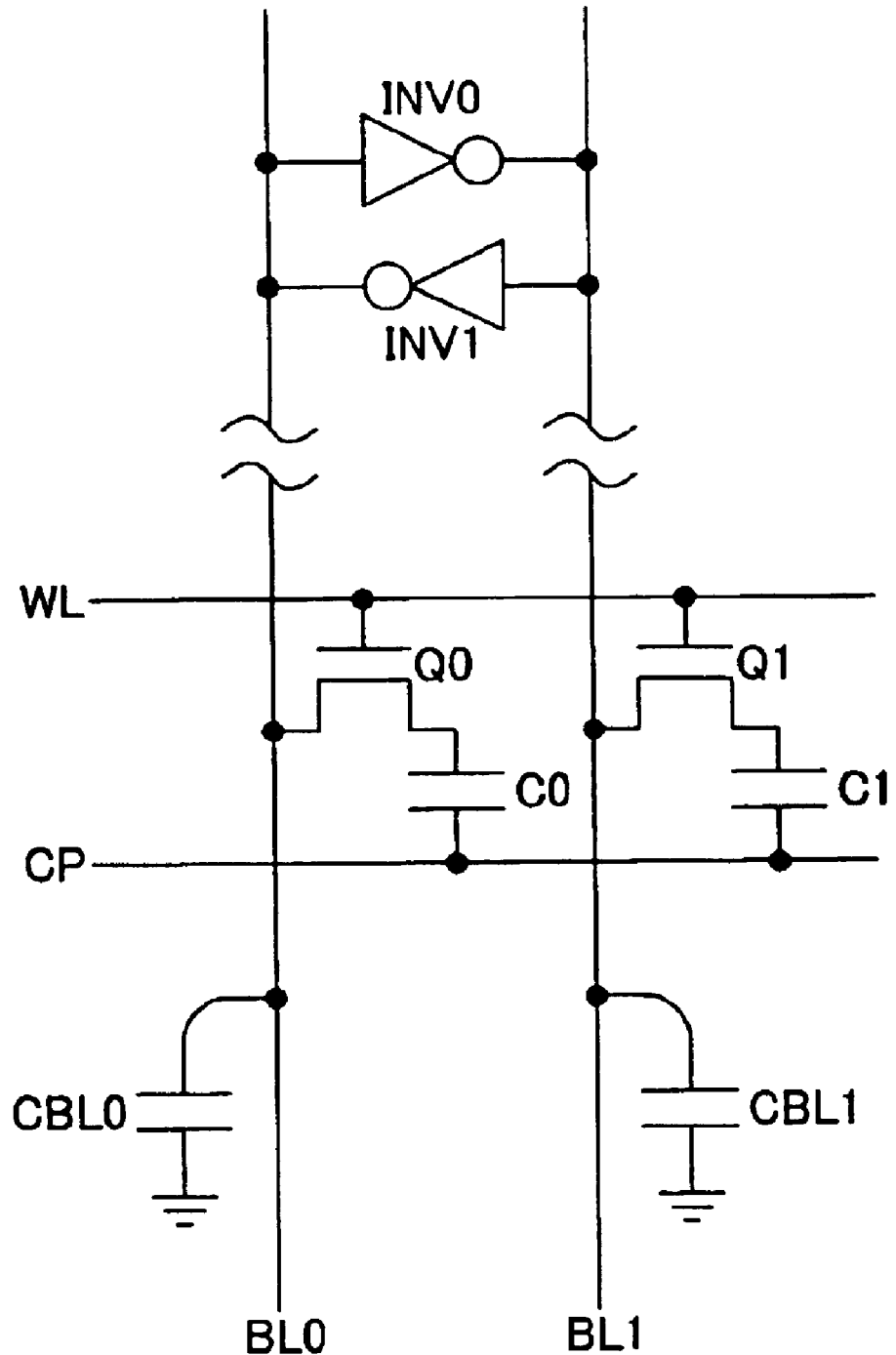
FIG. 22 is a view showing a memory cell and a peripheral circuit thereof in a conventional semiconductor memory device.
Figure 23:
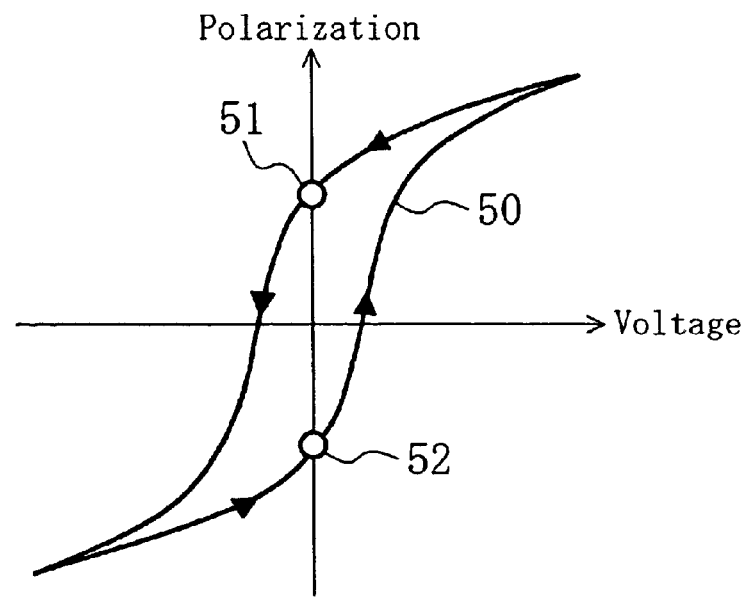
FIG. 23 is a view showing the hysteresis characteristic of polarization in each of ferroelectric capacitors composing the conventional semiconductor memory device.
Figure 24:
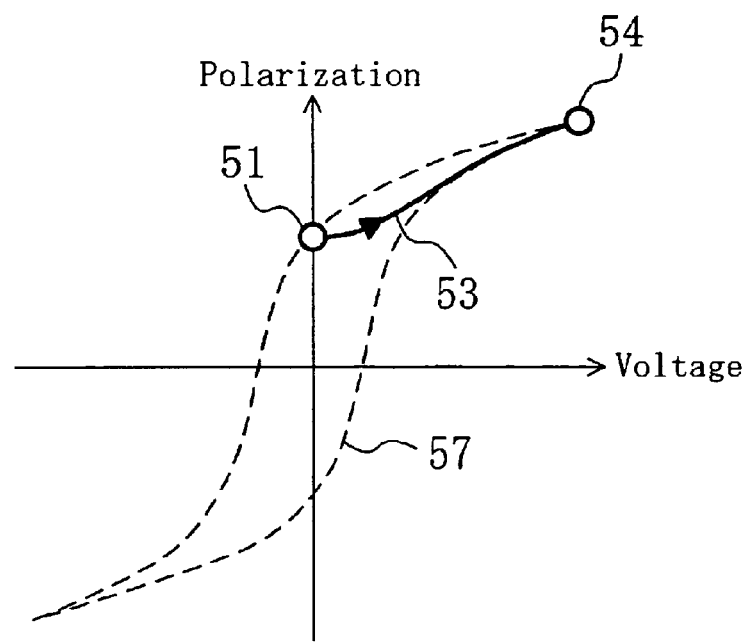
FIG. 24 is a view showing the hysteresis characteristic of polarization when data is written in the ferroelectric capacitor composing the conventional semiconductor memory device.
Figure 25:
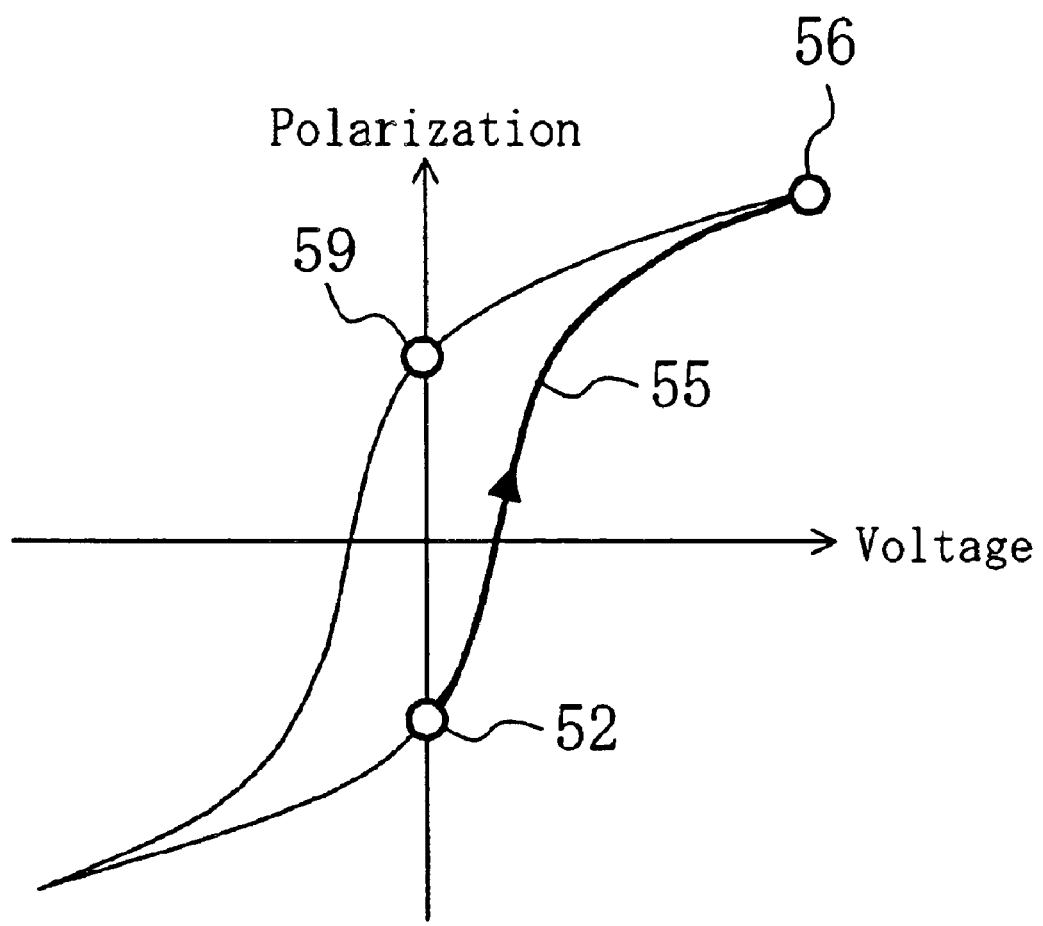
FIG. 25 is a view showing the hysteresis characteristic of polarization when data is read from the ferroelectric capacitor composing the conventional semiconductor memory device.
Figure 26A:
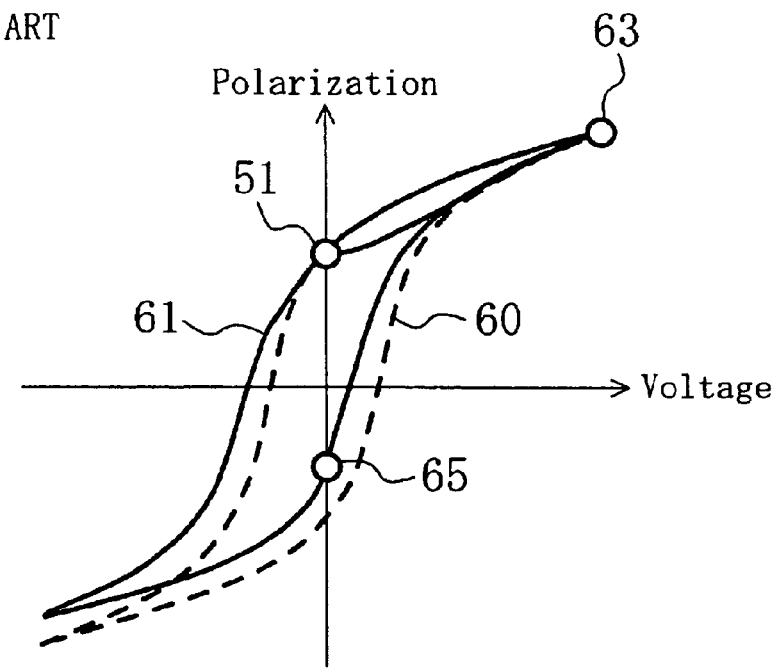
FIGS. 26A and 26B are views showing the hysteresis characteristic of polarization when complementary data sets are written in the ferroelectric capacitors composing the conventional semiconductor memory device.
Figure 26B:
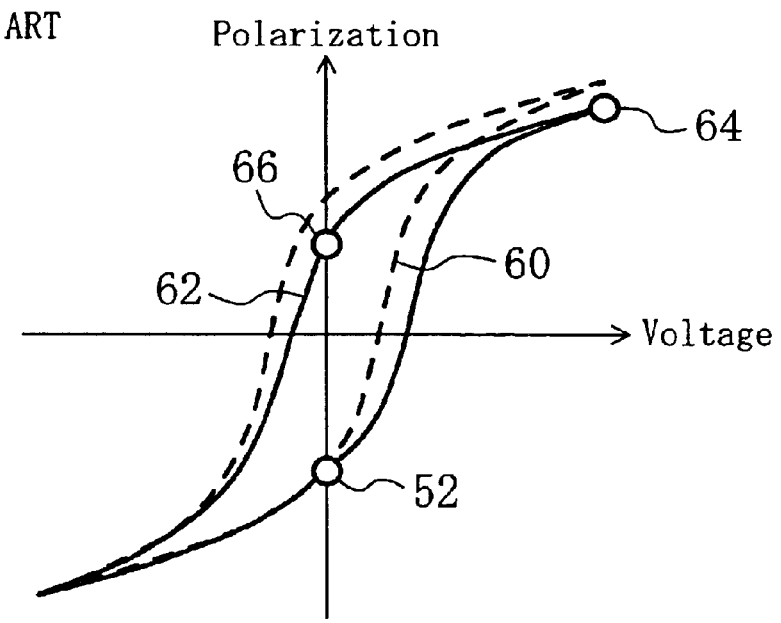

A description will be given herein below to a data read operation. In the data read operation, the bit lines BL0, BLR0, and BLR1 are precharged to a LOW potential and then the voltage pulses shown in FIG. 21D are applied thereto in the switching state shown in FIG. 20. The description will be given herein below by using the reading from the ferroelectric capacitor C0 in which the data "1" is recorded as an example.

First, the application of the word line activate signals PWL0 and PWLR causes the buffers BW0 and BWR to apply positive voltage pulses (each on the VPP level, e.g., 3.3 V) to the word lines WL0 and WLR, thereby bringing each of the pass transistors Q0, QR0, and QR1 into a conductive state. In this state, plate line activate signals RCP0 and RCPR are applied such that positive voltage pulses (each on the VDD level, e.g., 1.8 V) are outputted from the buffers BC0 and BCR onto the plate lines CP0 and CPR. As a result, the polarization in each of the ferroelectric capacitors C0 and CR0 located at the point 10 follows the locus 15 shown in FIG. 7A to reach the point 16. On the other hand, the polarization in the ferroelectric capacitor CR1 located at the point 14 follows the locus 17 shown in FIG. 7B to reach the point 18.

A charge corresponding to the difference between the respective values at the points 10 and 16 indicative of the initial polarization state and a new polarization state and a charge corresponding to the difference between the respective values at the points 14 and 18 indicative of the initial polarization state and a new state are generated in the bit line capacitance CBL0 of the bit line BL0, in the bit line capacitance CBLR0 of the bit line BLR0, and in the bit line capacitance CBLR1 of the bit line BLR1. If the polarization state is located at the point 10, the bit line is placed at the LOW potential (Vlo). If the polarization state is located at the point 14, the bit line is placed at the HIGH potential (Vhi). Since the bit lines BLR0 and BLR1 are short-circuited, the charges are mixed so that the bit-line potential becomes a middle potential (Vmi) between the potentials Vlo and Vhi. As a result, the potential on the bit line BL0 to which the memory cell is connected becomes Vlo and the potential on each of the bit lines BLR0 and BLR1 to which the reference cell is connected becomes Vmi. The bit-line potential difference is amplified by the sense amplifier composed of the cross-coupled inverters INV0 and INV1 so that the LOW potential is outputted to the data input/output port DL0.

If the data "0" is recorded in the ferroelectric capacitor C0, on the other hand, the polarization state is located at the point 14 so that the potential on the bit line BL0 becomes Vhi. The difference between the potential Vhi on the bit line BL0 and the potential Vmi on each of the bit lines BLR0 and BLR1 to which the reference cell is connected is amplified by the sense amplifier so that the HIGH potential is outputted to the data input/output port DL0.

By determining the output at the LOW potential from the bit line BL0 as the data "0" and the output at the HIGH potential from the bit line BL0 as the data "1", the reading of data is performed correctly.

After the reading of data, the plate line CP is restored to the LOW potential. At this time, the respective polarizations in the ferroelectric capacitors C0, CR0, and CR1 follow the locus 13 in FIG. 7A or the locus 19 in FIG. 7B to reach the point 10 or 20.

By the foregoing operation, the polarization state in each of the ferroelectric capacitors C0, CR0, and CR1 is destroyed so that the polarization state of the same polarity is observed in each of the ferroelectric capacitors C0, CR0 and CR1.

Accordingly, the switch SW31 is switched to the right position with the SW switching timing indicated by the arrow in FIG. 21D to provide respective connections between the AND gates AND0, ANDR0, and ANDR1 and the bit lines BL0, BLR0, and BLR1, thereby applying the plate line activate signals PCP0 and PCPR and the write activate signal PDW. Since the sense amplifier latches the read data, the data is written again in the ferroelectric capacitor C0 of the memory cell, while the ferroelectric capacitors CR0 and CR1 of the reference cell are restored to the complementary polarization states, whereby the read operation is completed.

Although the third embodiment has set the positive voltage pulse outputted from each of the buffers BC0, BC1, and BCR onto the plate line CP at the VDD level, e.g., 1.8 V in the same-polarization-value writing step, it is more preferable to apply a pulse with a larger voltage value within a rate voltage range. The application of a large voltage achieves a reduction in the time of the subsequent high-temperature preserving step.

What is claimed is:

1. A semiconductor memory device comprising:
   a plurality of memory cells each having a first ferroelectric capacitor for storing data as a polarization value;
   first voltage applying means for applying a first read voltage between a pair of electrodes of the first ferroelectric capacitor composing the one of the plurality of memory cells from which data is to be read; and
   reading means for detecting the polarization value in the first ferroelectric capacitor when the first read voltage is applied between the pair of electrodes of the first ferroelectric capacitor and thereby reading the data stored in the first ferroelectric capacitor therefrom,
   a hysteresis loop in the first ferroelectric capacitor is shifted in a direction of voltage opposite in polarity to the first read voltage.

2. The semiconductor memory device of claim 1, wherein the data is complementary data sets and each of the plurality of memory cells has the first ferroelectric capacitors forming a pair to store the complementary data sets.

3. The semiconductor memory device of claim 2, further comprising:
   means for writing the same polarization value in each of the first ferroelectric capacitors forming the pair.

4. The semiconductor memory device of claim 1, wherein the data is binary data and each of the plurality of memory cells has, on a one-by-one basis, the first ferroelectric capacitor for storing the binary data, the semiconductor memory device further comprising:
   a reference cell having a second ferroelectric capacitor for storing the binary data as a polarization value; and
   second voltage applying means for applying a second read voltage between a pair of electrodes of the second ferroelectric capacitor, wherein
   the reading means compares the polarization value in the first ferroelectric capacitor when the first read voltage is applied between the pair of electrodes of the first ferroelectric capacitor with the polarization value in the second ferroelectric capacitor when the second read voltage is applied between the pair of electrodes of the second ferroelectric capacitor and reads the binary data stored in the first ferroelectric capacitor therefrom and
   a hysteresis loop in the second ferroelectric capacitor is shifted in a direction of voltage opposite in polarity to the second read voltage.

5. The semiconductor memory device of claim 4, wherein the reference cell is composed of a first reference cell having the second ferroelectric capacitor for storing the polarization value corresponding to one of complementary data sets and a second reference cell having the second ferroelectric capacitor for storing the polarization value corresponding to the other of the complementary data sets, the semiconductor memory device further comprising:
   means for writing the same polarization value in each of the first and second ferroelectric capacitors.

6. A method for fabricating a semiconductor memory device comprising a plurality of memory cells each having a ferroelectric capacitor for storing data as a polarization value and reading means for applying a read voltage between a pair of electrodes of the ferroelectric capacitor composing the one of the plurality of memory cells from which data is to be read, detecting the polarization value in the ferroelectric capacitor, and thereby reading the data stored in the ferroelectric capacitor therefrom, the method comprising the step of:
   applying an AC voltage in which a first voltage having the same polarity as the read voltage is larger in absolute value than a second voltage having a polarity opposite to that of the read voltage to the ferroelectric capacitor a plurality of times.

7. A method for fabricating a semiconductor memory device comprising a plurality of memory cells each having a pair of ferroelectric capacitors for storing complementary data sets as polarization values, voltage applying means for applying a read voltage between a pair of electrodes of each of the pair of ferroelectric capacitors composing the one of the plurality of memory cells from which data is to be read, and reading means for detecting the polarization values in the pair of ferroelectric capacitors when the read voltage is applied between the pair of electrodes of each of the pair of ferroelectric capacitors and thereby reading the complementary data sets stored in the pair of ferroelectric capacitors therefrom, the method comprising the step of:
   writing the same polarization value in each of the pair of ferroelectric capacitors and heating the pair of ferroelectric capacitors in each of which the same polarization value has been written to shift a hysteresis loop in each of the pair of ferroelectric capacitors in a direction of voltage opposite in polarity to the read voltage.

8. The method of claim 7, wherein the step of writing the same polarization value in each of the pair of ferroelectric capacitors includes the step of applying a write voltage higher than the voltage applied between the pair of electrodes of the pair of ferroelectric capacitors during a normal operation.

9. The method of claim 7, wherein the step of heating the pair of ferroelectric capacitors is performed at a temperature higher than a temperature reached by each of the pair of ferroelectric capacitors during a normal operation.

10. A method for fabricating a semiconductor memory device comprising a plurality of memory cells each having a first ferroelectric capacitor for storing binary data as a polarization value, first voltage applying means for applying a first read voltage between a pair of electrodes of the first ferroelectric capacitor composing the one of the plurality of memory cells from which data is to be read, a reference cell having a second ferroelectric capacitor for storing binary data as a polarization value, second voltage applying means for applying a second read voltage between a pair of electrodes of the second ferroelectric capacitor, and reading means for comparing the polarization value in the first ferroelectric capacitor when the first read voltage is applied between the pair of electrodes of the first ferroelectric capacitor with the polarization value in the second ferroelectric capacitor when the second read voltage is applied between the pair of electrodes of the second ferroelectric capacitor and reading the binary data stored in the first ferroelectric capacitor therefrom, the method comprising the steps of:

writing the same polarization value in each of the first and second ferroelectric capacitors and heating the first and second ferroelectric capacitors in each of which the same polarization value has been written to shift a hysteresis loop in the first ferroelectric capacitor in a direction of voltage opposite in polarity to the first read voltage and shift a hysteresis loop in the second ferroelectric capacitor in a direction of voltage opposite in polarity to the second read voltage.

11. The method of claim 10, wherein the step of writing the same polarization in each of the first and second ferroelectric capacitors includes the step of applying a write voltage higher than each of the voltages applied between the respective pairs of electrodes of the first and second ferroelectric capacitors during a normal operation.

12. The method of claim 10, wherein the step of heating the first and second ferroelectric capacitors is performed at a temperature higher than respective temperatures reached by the first and second ferroelectric capacitors during a normal operation.

13. A method for driving a semiconductor memory device comprising a plurality of memory cells each having a ferroelectric capacitor for storing binary data as a polarization value, voltage applying means for applying a read voltage between a pair of electrodes of the ferroelectric capacitor composing the one of the plurality of memory cells from which data is to be read, and reading means for detecting the polarization value in the ferroelectric capacitor when the read voltage is applied between the pair of electrodes of the ferroelectric capacitor and thereby reading the data stored in the ferroelectric capacitor therefrom, a hysteresis loop in the ferroelectric capacitor being shifted in a direction of voltage opposite in polarity to the read voltage, the method comprising the step of:

applying a write voltage to each of the pair of electrodes of the ferroelectric capacitor such that a first absolute value of the polarization in the ferroelectric capacitor when one of the binary data is stored and a second absolute value of the polarization value in the ferroelectric capacitor when the other of the binary data is stored are different from each other.

14. The method of claim 13, wherein a polarity of the write voltage corresponding to the larger one of the first and second absolute values and a polarity of the read voltage are equal to each other.

15. The method of claim 13, wherein the smaller one of the first and second absolute values is substantially zero.

16. The method of claim 13, wherein a first write voltage with which the polarization in the ferroelectric capacitor has the first absolute value and a second write voltage with which the polarization in the ferroelectric capacitor has the second absolute value are supplied from different voltage sources.

17. The method of claim 13, wherein the read voltage is not more than a coercive voltage of the ferroelectric capacitor.

* * * * *